US010612916B2

(12) United States Patent
Shchegrov et al.

(10) Patent No.: US 10,612,916 B2
(45) Date of Patent: Apr. 7, 2020

(54) MEASUREMENT OF MULTIPLE PATTERNING PARAMETERS

(71) Applicant: KLA-Tencor Corporation, Milpitas, CA (US)

(72) Inventors: Andrei V. Shchegrov, Campbell, CA (US); Shankar Krishnan, Santa Clara, CA (US); Kevin Peterlinz, Fremont, CA (US); Thaddeus Gerard Dziura, San Jose, CA (US); Noam Sapiens, Cupertino, CA (US); Stilian Ivanov Pandev, Santa Clara, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/784,153

(22) Filed: Oct. 15, 2017

(65) Prior Publication Data

US 2018/0051984 A1 Feb. 22, 2018

Related U.S. Application Data

(63) Continuation of application No. 15/268,217, filed on Sep. 16, 2016, now Pat. No. 9,816,810, which is a
(Continued)

(51) Int. Cl.
*G01B 11/27* (2006.01)
*H01L 21/66* (2006.01)
(Continued)

(52) U.S. Cl.
CPC ........ *G01B 11/272* (2013.01); *G03F 7/70141* (2013.01); *H01L 22/12* (2013.01);
(Continued)

(58) Field of Classification Search
CPC .............. G01B 11/272; G01B 2210/56; G03F 7/70141; G03F 7/0002; G03F 7/70625; H01L 22/12; H01L 22/30
See application file for complete search history.

(56) References Cited

U.S. PATENT DOCUMENTS

| 5,608,526 A | 3/1997 | Piwonka-Corle et al. |
| 5,859,424 A | 1/1999 | Norton et al. |
(Continued)

FOREIGN PATENT DOCUMENTS

| CN | 101401080 A | 4/2009 |
| CN | 101495833 A | 7/2009 |
(Continued)

OTHER PUBLICATIONS

International Search Report dated Apr. 27, 2015, for PCT Application No. PCT/US2014/072241 filed on Dec. 23, 2014 by KLA-Tencor Corporation, 3 pages.
(Continued)

*Primary Examiner* — Sang H Nguyen
(74) *Attorney, Agent, or Firm* — Spano Law Group; Joseph S. Spano

(57) ABSTRACT

Methods and systems for evaluating the performance of multiple patterning processes are presented. Patterned structures are measured and one or more parameter values characterizing geometric errors induced by the multiple patterning process are determined. In some examples, a single patterned target and a multiple patterned target are measured, the collected data fit to a combined measurement model, and the value of a structural parameter indicative of a geometric error induced by the multiple patterning process is determined based on the fit. In some other examples, light having a diffraction order different from zero is collected and analyzed to determine the value of a structural parameter that is indicative of a geometric error induced by a multiple
(Continued)

patterning process. In some embodiments, a single diffraction order different from zero is collected. In some examples, a metrology target is designed to enhance light diffracted at an order different from zero.

5 Claims, 19 Drawing Sheets

Related U.S. Application Data continuation of application No. 14/574,021, filed on Dec. 17, 2014, now Pat. No. 9,490,182.

(60) Provisional application No. 61/920,462, filed on Dec. 23, 2013.

(51) Int. Cl.
    G03F 7/20       (2006.01)
    G03F 7/00       (2006.01)
(52) U.S. Cl.
    CPC .......... *H01L 22/30* (2013.01); *G01B 2210/56* (2013.01); *G03F 7/0002* (2013.01); *G03F 7/70625* (2013.01)

(56) References Cited

U.S. PATENT DOCUMENTS

| | | | |
|---|---|---|---|
| 6,429,943 B1 | 8/2002 | Opsal et al. | |
| 6,673,638 B1 | 1/2004 | Bendik et al. | |
| 7,042,569 B2 | 5/2006 | Sezginer et al. | |
| 7,061,615 B1* | 6/2006 | Lowe-Webb | G02B 27/4255 257/797 |
| 7,321,426 B1 | 1/2008 | Poslavsky et al. | |
| 7,478,019 B2 | 1/2009 | Zangooie et al. | |
| 7,557,921 B1 | 7/2009 | Adel et al. | |
| 7,564,557 B2 | 7/2009 | Mieher et al. | |
| 7,700,247 B2 | 4/2010 | Ausschnitt et al. | |
| 7,933,026 B2 | 4/2011 | Opsal et al. | |
| 7,940,386 B1* | 5/2011 | Bevis | G01N 21/4785 356/243.4 |
| 8,129,080 B2 | 3/2012 | Fonseca et al. | |
| 8,142,966 B2 | 3/2012 | Izikson et al. | |
| 8,197,996 B2 | 6/2012 | Fonseca et al. | |
| 8,289,515 B2 | 10/2012 | Cohen et al. | |
| 8,418,105 B1 | 4/2013 | Wang | |
| 8,843,875 B2 | 9/2014 | Pandev | |
| 9,127,927 B2 | 9/2015 | Iloreta et al. | |
| 9,678,421 B2* | 6/2017 | Levinski | G03F 1/42 |
| 2002/0158193 A1* | 10/2002 | Sezginer | G03F 7/70633 250/237 G |
| 2003/0002043 A1* | 1/2003 | Abdulhalim | G03F 7/70633 356/400 |
| 2004/0190008 A1 | 9/2004 | Mieher et al. | |
| 2004/0233439 A1* | 11/2004 | Mieher | G01N 21/956 356/401 |
| 2004/0246476 A1 | 12/2004 | Bevis et al. | |
| 2004/0246482 A1* | 12/2004 | Sezginer | G01N 21/4788 356/401 |
| 2005/0122516 A1* | 6/2005 | Sezginer | G03F 7/70633 356/401 |
| 2005/0195398 A1* | 9/2005 | Adel | B82Y 10/00 356/401 |
| 2005/0275848 A1 | 12/2005 | Hill | |
| 2006/0167651 A1 | 7/2006 | Zangooie et al. | |
| 2007/0135959 A1 | 6/2007 | Vuong et al. | |
| 2007/0211260 A1 | 9/2007 | Vuong et al. | |
| 2007/0238201 A1 | 10/2007 | Funk et al. | |
| 2007/0279630 A1* | 12/2007 | Kandel | G03F 7/70633 356/401 |
| 2008/0183442 A1 | 7/2008 | Loo et al. | |
| 2008/0311344 A1* | 12/2008 | Marie Kiers | G01N 21/4788 428/138 |
| 2009/0041971 A1* | 2/2009 | Wang | G02B 5/1809 428/54 |
| 2009/0296075 A1 | 12/2009 | Hu et al. | |
| 2010/0141948 A1 | 6/2010 | Cohen et al. | |
| 2010/0209830 A1 | 8/2010 | Carcasi et al. | |
| 2010/0224854 A1* | 9/2010 | Lee | H01L 33/20 257/13 |
| 2011/0141873 A1* | 6/2011 | Miyasaka | G02B 1/115 369/112.03 |
| 2012/0033215 A1* | 2/2012 | Kandel | G03F 7/70683 356/366 |
| 2012/0292502 A1 | 11/2012 | Langer et al. | |
| 2012/0292902 A1 | 11/2012 | Yamamura et al. | |
| 2013/0107259 A1* | 5/2013 | Choi | G03F 7/70683 356/401 |
| 2013/0110477 A1 | 5/2013 | Pandev | |
| 2013/0155406 A1 | 6/2013 | Jeffery et al. | |
| 2013/0222795 A1* | 8/2013 | Madsen | G01B 11/0625 356/237.5 |
| 2013/0262044 A1 | 10/2013 | Pandev et al. | |
| 2013/0271740 A1* | 10/2013 | Quintanilha | G03F 1/144 355/67 |
| 2013/0305206 A1 | 11/2013 | Pandev | |
| 2014/0111791 A1 | 4/2014 | Manassen et al. | |
| 2014/0172394 A1 | 6/2014 | Kuznetsov et al. | |
| 2014/0199791 A1 | 7/2014 | Park et al. | |
| 2014/0222380 A1 | 8/2014 | Kuznetsov et al. | |
| 2014/0256067 A1 | 9/2014 | Cheng et al. | |
| 2014/0297211 A1 | 10/2014 | Pandev et al. | |
| 2014/0316730 A1 | 10/2014 | Shchegrov et al. | |
| 2014/0347666 A1 | 11/2014 | Veldman et al. | |
| 2016/0117812 A1 | 4/2016 | Pandev et al. | |
| 2016/0117847 A1 | 4/2016 | Pandev et al. | |

FOREIGN PATENT DOCUMENTS

| | | |
|---|---|---|
| CN | 103398666 A | 11/2013 |
| TW | 1324248 | 5/2010 |
| WO | 2012080008 A2 | 6/2012 |
| WO | 2013067064 A1 | 5/2013 |

OTHER PUBLICATIONS

Bunday, Benjamin et al., CD-SEM Utility with Double Patterning, Metrology, Inspection, and Process Control for Microlithography XXIV, Proc. of SPIE vol. 7638, 76382U (2010).

Solecky, Eric et al., In-line E-beam Wafer Metrology and Defect Inspection: The End of an Era for Image-based Critical Dimensional Metrology? New life for Defect Inspection, Metrology, Inspection, and Process Control for Microlithography XXVII, Proc. of SPIE vol. 8681, 86810D (2013).

* cited by examiner

MEASUREMENT OF MULTIPLE PATTERNING PARAMETERS

CROSS REFERENCE TO RELATED APPLICATION

The present application for patent is a continuation of, and claims priority under 35 U.S.C. § 120 from, U.S. patent application Ser. No. 15/268,217, entitled "Measurement Of Multiple Patterning Parameters," filed Sep. 16, 2016, which, in turn claims priority under 35 U.S.C. § 120 from, U.S. patent application Ser. No. 14/574,021, entitled "Measurement Of Multiple Patterning Parameters," filed Dec. 17, 2014, which, in turn claims priority under 35 U.S.C. § 119 from U.S. provisional patent application Ser. No. 61/920, 462, entitled "Method and Apparatus for Measuring Parameters of Multiple Patterning," filed Dec. 23, 2013, the subject matter of which is incorporated herein by reference in its entirety.

TECHNICAL FIELD

The described embodiments relate to metrology systems and methods, and more particularly to methods and systems for improved measurement of parameters characterizing the dimensions of structures generated by multiple patterning processes.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Multiple patterning techniques are now commonly employed to increase the resolution of features printed onto the semiconductor wafer for a given lithographic system. FIGS. 1A-1D depict a double patterning lithography (DPL) technique commonly referred to as a litho-etch-litho-etch (LELE) process. FIG. 1A depicts a silicon base layer 10, an interface layer such as silicon dioxide, a device layer 12, a hard mask layer 13, a sacrificial layer 14, and a patterned resist layer 15 that results from a lithography patterning step. The structure of depicted in FIG. 1A is then subjected to exposure and etch steps that result in the structure illustrated in FIG. 1B. In this structure, the pattern of resist layer 15 has been effectively transferred to the hard mask layer 13. Both the sacrificial layer 14 and the patterned resist layer 15 have been removed. A number of deposition and lithographic steps are employed to arrive at the structure illustrated in FIG. 1C. FIG. 1C illustrates another sacrificial layer 16 and patterned resist layer 17 built on top of the hard mask layer 13. Patterned resist layer 17 includes a pattern having the same pitch as the first patterned resist layer 15, and also the same pitch as the pattern etched into the hard mask layer 13. However, the patterned resist layer 17 is offset from the pattern of the hard mask layer 13 by half of the pitch of the patterned resist layer 17. The structure of depicted in FIG. 1C is then subjected to exposure and etch steps that result in the structure illustrated in FIG. 1D. In this structure, the pattern of resist layer 17 has been effectively transferred to the hard mask layer 13. Both the sacrificial layer 16 and the patterned resist layer 17 have been removed. FIG. 1D illustrates a pattern etched into hard mask 13 that is double the pitch of the patterned resist layers 15 and 17 generated by the mask of the lithographic system.

FIG. 1D also depicts the effects of a non-optimized DPL process. Ideally, the nominal pitch of the double patterned structure should be a constant value, P. However, due to imperfections in the DPL process, the pitch of the resulting structure may vary depending on location due to grating non-uniformities. This is commonly termed "pitch walk." A variation from the nominal pitch, P, is depicted as $\Delta P$ in FIG. 1D. In another example, a critical dimension of each resulting structure should be the same nominal value, CD. However, due to imperfections in the DPL process, a critical dimension (e.g., middle critical dimension, bottom critical dimension, etc.) of the resulting structure may vary depending on location. A variation from the critical dimension, CD, is depicted as $\Delta CD$ in FIG. 1D.

Pitch walk and $\Delta CD$ are exemplary geometric errors induced by imperfections in the DPL process such as misalignment between the two lithography layers, non-uniformities in the focus and exposure of the lithographic process, mask pattern errors, etc. Both pitch walk and $\Delta CD$ introduce a unit cell that is larger than expected. Although pitch walk and $\Delta CD$ are described in particular, other multiple patterning errors may be contemplated.

Although the LELE process is described with reference to FIGS. 1A-1D, many other multiple patterning processes that induce similar errors may be contemplated (e.g., litho-litho-etch, spacer defined double patterning, etc.). Similarly, although a double patterning process is described with reference to FIGS. 1A-1D, similar errors arise in higher order patterning processes such as quadruple patterning. Typically, errors such as pitch walk and $\Delta CD$ are more pronounced in structures that result from higher order patterning processes.

Metrology processes are used at various steps during a semiconductor manufacturing process to detect defects on wafers to promote higher yield. Optical metrology techniques offer the potential for high throughput measurement without the risk of sample destruction. A number of optical metrology based techniques including scatterometry and reflectometry implementations and associated analysis algorithms are commonly used to characterize critical dimensions, film thicknesses, composition and other parameters of nanoscale structures.

However, measurement of errors induced by multiple patterning processes is especially challenging due to the fact that optical CD, and even CD-SEM measurements, lack significant sensitivity to these types of errors.

Metrology applications involving the measurement of structures generated by multiple patterning processes present challenges due to increasingly small resolution requirements, multi-parameter correlation, increasingly complex geometric structures, and increasing use of opaque materials. Thus, methods and systems for improved measurements are desired.

SUMMARY

Methods and systems for evaluating the performance of multiple patterning processes are presented. More specifically, geometric structures generated by multiple patterning processes are measured and one or more parameter values characterizing geometric errors induced by the multiple patterning process are determined in accordance with the methods and systems described herein.

In one aspect, the value of a structural parameter indicative of a geometric error induced by the multiple patterning process is determined based on a fitting of measurement data to a combined measurement model. The measurement data is collected from a number of measurement sites on the surface of a semiconductor wafer. Each measurement site includes at least two metrology targets. The first metrology target is generated by a single patterning step of a multiple patterning process. A second metrology target is generated by a multiple patterning steps, including the patterning step employed to generate the first metrology target.

The measurement model is a combined measurement model that links structural parameters, material parameters, or a combination of structural and material parameters of both the single patterned and multiple patterned metrology targets. In this manner, the measurement model captures a single step of a multiple patterning process and at least one subsequent step of the multiple patterning process in a combined measurement model.

The metrology targets are located as close together as possible to enhance the accuracy of the combined measurement model. In some embodiments, both metrology targets are located adjacent to one another at each measurement site. By locating the metrology targets close together, simplifying assumptions used to link parameters of both metrology targets are less likely to induce significant errors.

In a further aspect, the combined measurement model is formulated based on measurement data from metrology targets having known structural parameter values. More specifically, a structural parameter value (e.g., critical dimension, trench depth, sidewall angle, etc.) associated with the single patterned metrology target and a structural parameter value associated with the multiple patterned metrology target are known. In some embodiments, the metrology targets are simulated and the structural parameter values of both metrology targets are calculated as a result of the simulation. In some other embodiments, the metrology targets are actually manufactured and measured by a reference measurement system, and the structural parameter values are determined by the reference measurement system.

In another aspect, diffracted light having a diffraction order different from zero is collected and analyzed to determine the value of at least one structural parameter that is indicative of a geometric error induced by a multiple patterning process. In some embodiments, a single diffraction order different from zero is collected and analyzed to determine the value of at least one structural parameter that is indicative of a geometric error induced by a multiple patterning process.

In yet another aspect, a metrology target is designed with a relatively large variation in pitch to enhance measurement sensitivity based on measurements of light diffracted at a single order or multiple orders different from zero order.

In yet another aspect, multiple patterning errors are detected based on the presence of Rayleigh anomalies. Rayleigh anomalies appear when a propagating order goes evanescent. It is a spectral singularity that often appears as a sudden transition in a measured spectrum.

In yet another aspect, the measurement model results described herein are used to provide active feedback to a process tool (e.g., lithography tool, etch tool, deposition tool, etc.). For example, values of the structural parameters determined using the methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for evaluating the performance of multiple patterning processes are presented. More specifically, geometric structures generated by multiple patterning processes are measured and one or more parameter values characterizing geometric errors induced by the multiple patterning process are determined in accordance with the methods and systems described herein.

In one aspect, the value of a structural parameter indicative of a geometric error induced by the multiple patterning process is determined based on the measurement data and a combined measurement model. The measurement data is collected from a number of measurement sites on the surface of a semiconductor wafer. Each measurement site includes at least two metrology targets. The first metrology target is a single patterned metrology target generated by a first patterning step of a multiple patterning process. In some embodiments the single patterned metrology target is a grating having a constant nominal pitch. A second metrology target is a multiple patterned metrology target generated by a multiple patterning process that includes the first patterning step and at least one subsequent patterning step. In some embodiments, the multiple patterned metrology target is also a grating structure having a constant nominal pitch that is smaller than the single patterned metrology target.

The measurement model is a combined measurement model that links structural parameters, material parameters, or a combination of structural and material parameters of both the single patterned and multiple patterned metrology targets. In this manner, the measurement model captures the first step of a multiple patterning process and at least one subsequent step of the multiple patterning process in a combined measurement model.

The metrology targets are located as close together as possible to enhance the accuracy of the combined measurement model. In some embodiments, both metrology targets are located adjacent to one another at each measurement site. By locating the metrology targets close together, simplifying assumptions used to link parameters of both metrology targets are less likely to induce significant errors. For example, the thickness of an underlying layer is very likely to be the same value for both metrology targets as long as the targets are located in close proximity. Thus, for adjacent metrology targets, the thickness of the underlying layer can be treated as the same constant value without inducing significant error.

Figure 1A:
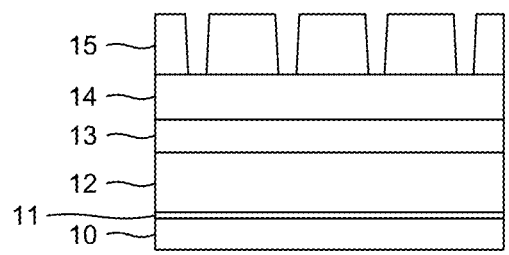
FIGS. 1A-1D depict selected steps of a double patterning lithography (DPL) technique commonly referred to as a litho-etch-litho-etch (LELE) process.
Figure 1B:
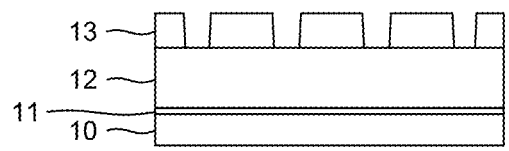
Figure 1C:
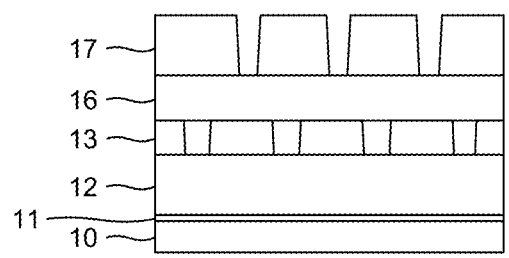
Figure 1D:
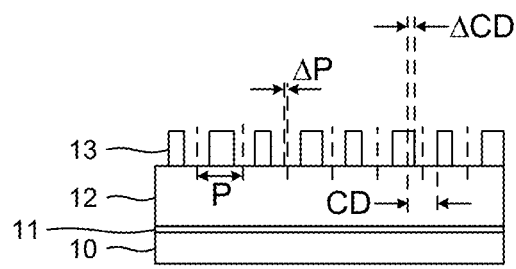
Figure 2:
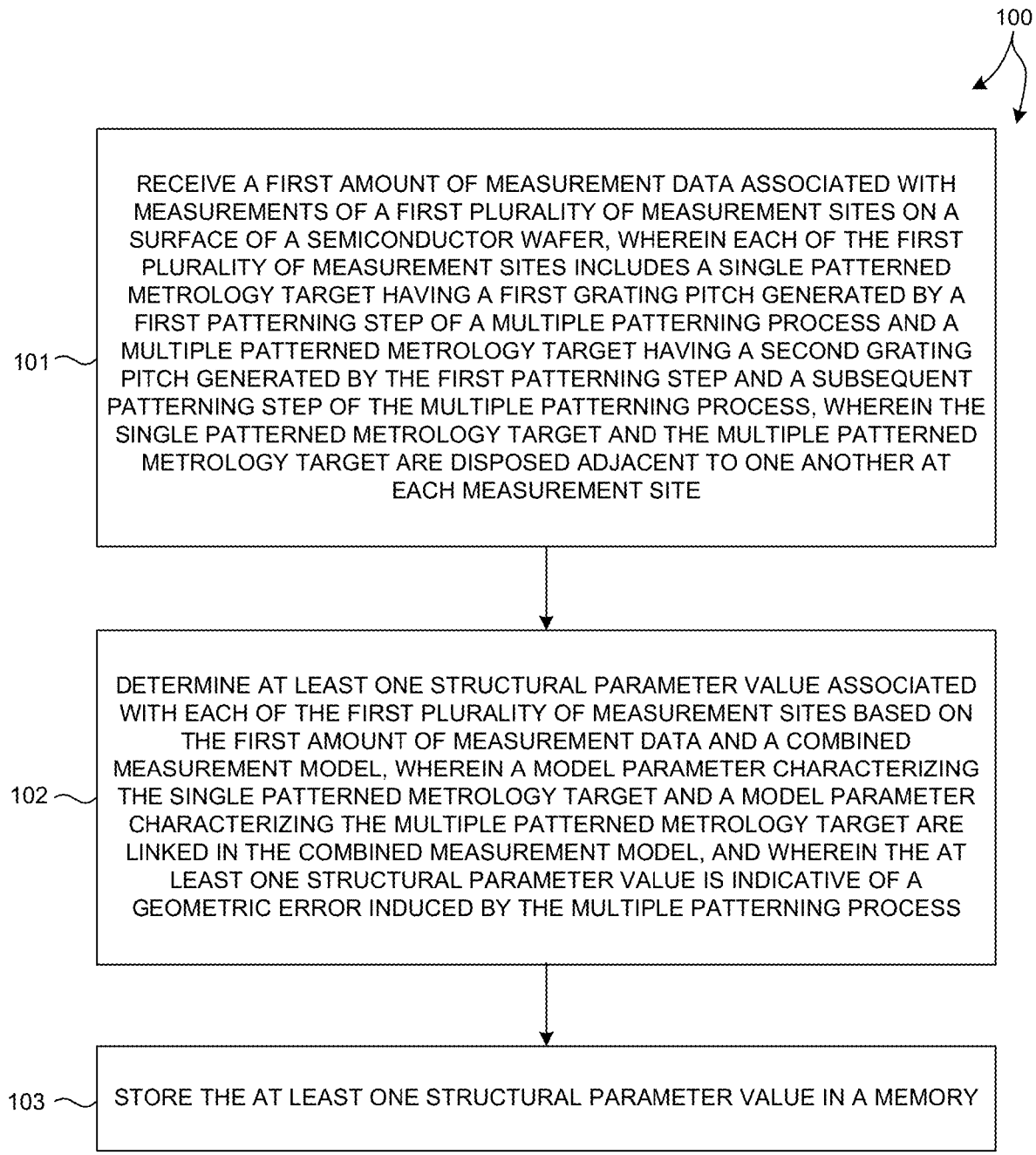
FIG. 2 is a flowchart illustrative of a method 100 of determining one or more parameter values characterizing geometric errors induced by a multiple patterning process.
Figure 9:
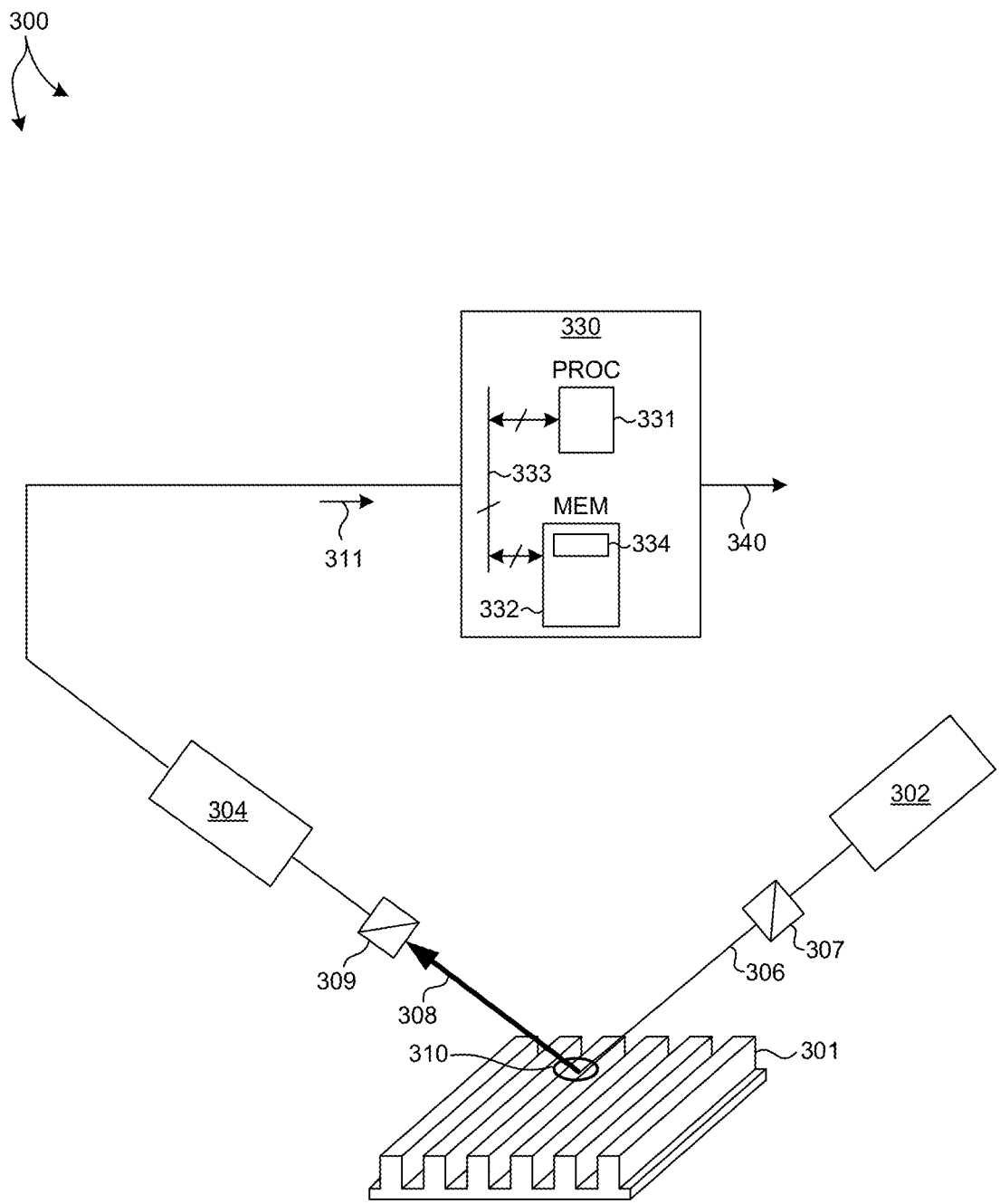
FIG. 9 illustrates a system 300 for measuring characteristics of a specimen in accordance with the exemplary methods presented herein.

FIG. 2 illustrates a method 100 suitable for implementation by a metrology system such as metrology system 300 illustrated in FIG. 9 of the present invention. In one aspect, it is recognized that data processing blocks of method 100 may be carried out via a pre-programmed algorithm executed by one or more processors of computing system 330, or any other general purpose computing system. It is recognized herein that the particular structural aspects of metrology system 300 do not represent limitations and should be interpreted as illustrative only.

In block 101, first amount of measurement data associated with measurements of a first plurality of measurement sites on a surface of a semiconductor wafer are received by a computing system (e.g., computing system 330).

Each of the first plurality of measurement sites includes a single patterned metrology target having a first grating pitch generated by a first patterning step of a multiple patterning process and a multiple patterned metrology target having a second grating pitch generated by the first patterning step and a subsequent patterning step of the multiple patterning process. In some embodiments, the single patterned metrology target and the multiple patterned metrology target are disposed adjacent to one another at each measurement site.

Figure 6:
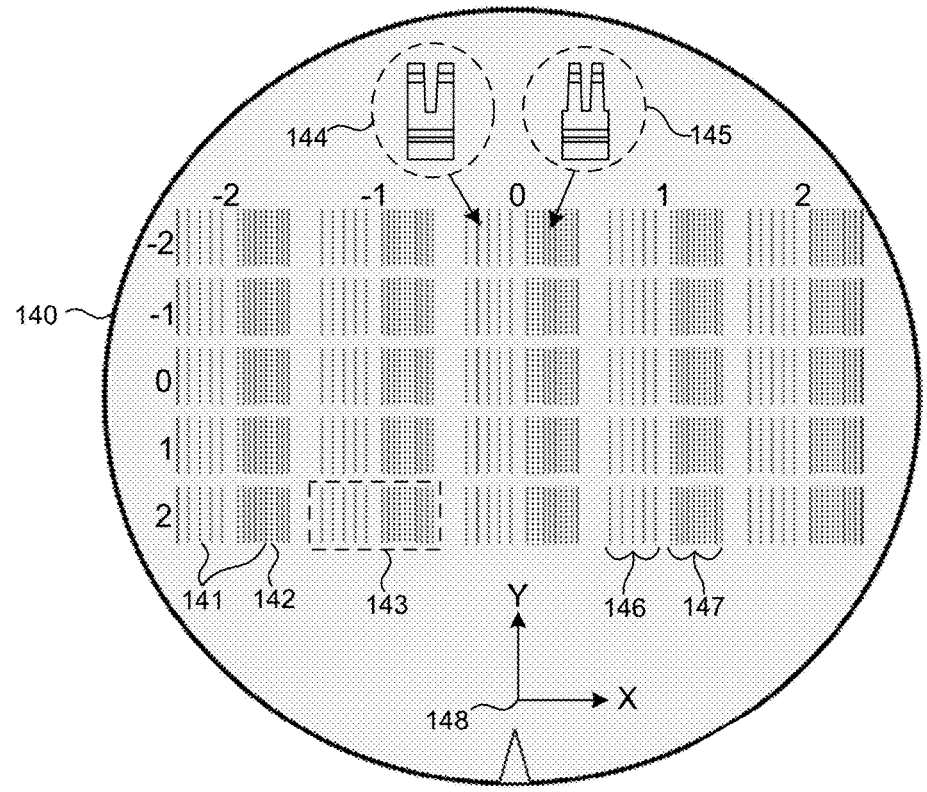
FIG. 6 depicts a semiconductor wafer 140 having a number of die located at various measurement sites over the surface of the wafer, each having nominal structural parameter values.
Figure 7A:
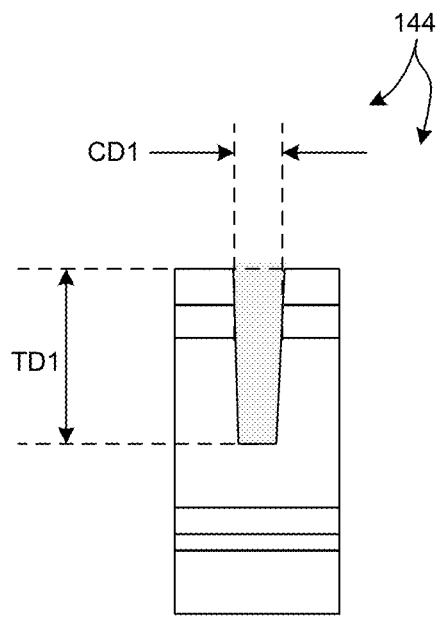
FIGS. 7A-7B depict detailed views of a single patterned unit cell and a multiple patterned unit cell, respectively.
Figure 7B:
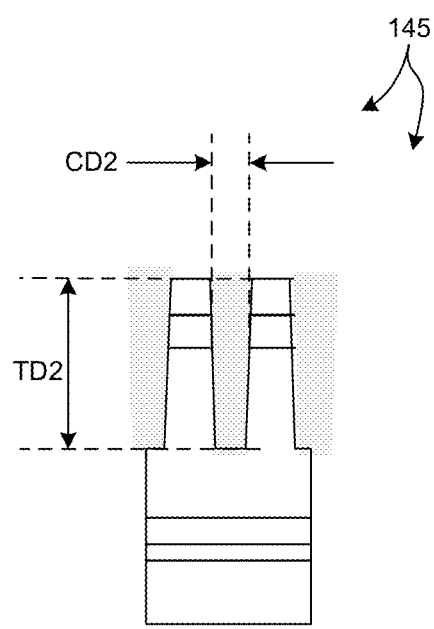

FIG. 6 depicts a semiconductor wafer 140 having a number of die (e.g., die 143) located at various measurement sites over the surface of the wafer. In the embodiment depicted in FIG. 6, the die are located at measurement sites arranged in a rectangular grid pattern in alignment with the depicted x and y coordinate frame 148. Each die includes a single patterned metrology target (e.g., single patterned metrology target 146) and a multiple patterned metrology target (e.g., multiple patterned metrology target 147). In the embodiment depicted in FIG. 6, each single patterned metrology target includes a set of lines (e.g., the set of lines including line 141) that result from a first patterning step. Each multiple patterned metrology target includes the set of lines that result from a first patterning step along with at least one more set of interposed lines (e.g., the set of lines including line 142) that result from a subsequent step in the multiple patterning process. As a result, each single patterned metrology target includes a grating structure having a repeated pattern of trench structures such as the single patterned unit cell 144 depicted in FIG. 6. Similarly, each multiple patterned metrology target includes a grating structure having a repeated pattern of trench structures such as the multiple patterned unit cell 145 depicted in FIG. 6. FIG. 7A depicts single patterned unit cell 144 in greater detail. As depicted in FIG. 7A, the geometry of single patterned unit cell 144 is characterized by a critical dimension of the trench structure (CD1) and a depth of the trench structure (TD1). Similarly, FIG. 7B depicts multiple patterned unit cell 145 in greater detail. As depicted in FIG. 7B, the geometry of multiple patterned unit cell 145 is characterized by a critical dimension of the trench structure (CD2) and a depth of the trench structure (TD2). The values of these structural parameters are indicative of geometric errors induced by the multiple patterning process. The particular structural parameters described herein (i.e., CD and TD) are provided by way of non-limiting example. In general, many other structural parameters (e.g., sidewall angle, bottom critical dimension, etc.) may be employed to indicate geometric errors induced by the multiple patterning process.

Wafer 140 includes an array of nominally valued structures. Thus, CD1, CD2, TD1, and TD2 have the same nominal values regardless of location on the wafer 140. In this manner, wafer 140 can be considered a product wafer.

In some examples, the first amount of measurement data includes two ellipsometric parameters ($\psi$, $\Delta$) over a spectral range obtained at different measurement sites. In some examples, the first amount of measurement data is associated with actual measurements of the measurement sites on the surface of an actual product wafer (e.g., wafer 140). The measurement data includes spectral measurements associated with the single pattern metrology target and the multiple pattern metrology target associated with each measurement site. In some other examples, the first amount of measurement data is associated with simulations of measurements of the measurement sites on the surface of a semiconductor wafer (e.g., wafer 140). Similarly, the measurement data includes simulated spectral measurements associated with the single pattern metrology target and the multiple pattern metrology target associated with each measurement site.

Although, in some examples, the measurement data is spectral measurement data, in general, the measurement data may be any measurement data indicative of the structural or geometric properties of the structures patterned onto the surface of a semiconductor wafer. In block 102, at least one structural parameter value associated with each of the first plurality of measurement sites is determined based on the first amount of measurement data and a combined measurement model. At least one model parameter characterizing the single patterned metrology target is linked to at least model parameter characterizing the multiple patterned metrology target in the combined measurement model. For example, underlying layers (e.g., oxide base layers of a semiconductor material stack on a semiconductor wafer) are assumed to be uniformly thick over a limited, local area of the wafer surface. Thus, the thickness of the underlying layer in the combined model of both the first metrology target and the second metrology target are assumed to be the same value. In another example, the etch conditions over a limited local area of the wafer surface are assumed to be uniform, thus, the resulting sidewall angle of patterned features within the limited, local area (i.e., the first and second metrology targets) are assumed to be the same. The value of the structural parameter is indicative of a geometric error induced by the multiple patterning process. In some examples, the structural parameter values are calculated directly from the model. In some other examples, the structural parameter values are determined by fitting the model to the measurement data. In one example, the combined model is used to calculate spectra from candidate structural parameter values. These results are compared with the measured spectra. This process is iterated until the the spectral difference is minimized for optimal values of the structural parameters.

In block 103, the structural parameter value is stored in a memory (e.g., memory 332).

In a further aspect, the combined measurement model is formulated based on measurement data from metrology targets having known structural parameter values. More specifically, a structural parameter value (e.g., critical dimension, trench depth, sidewall angle, etc.) associated with the single patterned metrology target generated by the first patterning step and a structural parameter value associated with the multiple patterned metrology target generated by a subsequent patterning step are known. In some embodiments, the metrology targets are simulated and the structural parameter values of both metrology targets are calculated as a result of the simulation. In some other embodiments, the metrology targets are actually manufactured and measured by a reference measurement system, and the structural parameter values are determined by the reference measurement system.

In some examples, the combined measurement model predicts the measured optical signals based on a multi-target model that characterizes the interaction of both the single patterned and multiple patterned metrology targets with the particular metrology system.

Figure 3:
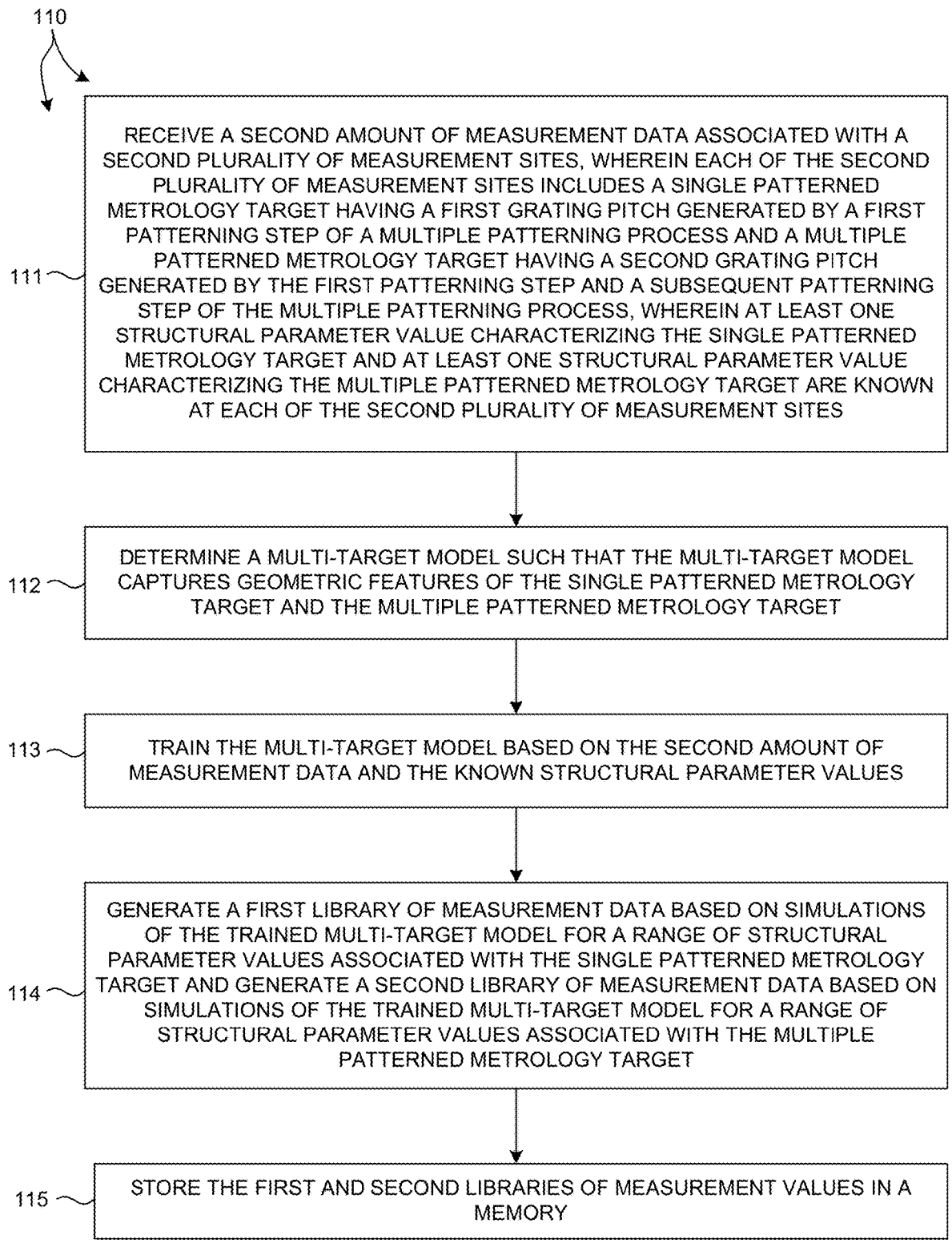
FIG. 3 is a flowchart illustrative of a method 110 of formulating and training a combined model useful to determine one or more parameter values characterizing geometric errors induced by a multiple patterning process.

FIG. 3 illustrates a method 110 suitable for implementation by a metrology system such as metrology system 300 illustrated in FIG. 9 of the present invention. In one aspect, it is recognized that data processing blocks of method 110 may be carried out via a pre-programmed algorithm executed by one or more processors of computing system 330, or any other general purpose computing system. It is recognized herein that the particular structural aspects of metrology system 300 do not represent limitations and should be interpreted as illustrative only.

In block 111, a second amount of measurement data associated with measurements of a second plurality of measurement sites are received by a computing system (e.g., computing system 330). Each of the second plurality of measurement sites includes a single patterned metrology target having a first grating pitch generated by a first patterning step of a multiple patterning process and a multiple patterned metrology target having a second grating pitch generated by the first patterning step and a subsequent patterning step of the multiple patterning process. At least one structural parameter value characterizing the single patterned metrology target and at least one structural parameter value characterizing the multiple patterned metrology target are known at each of the second plurality of measurement sites.

Figure 5:
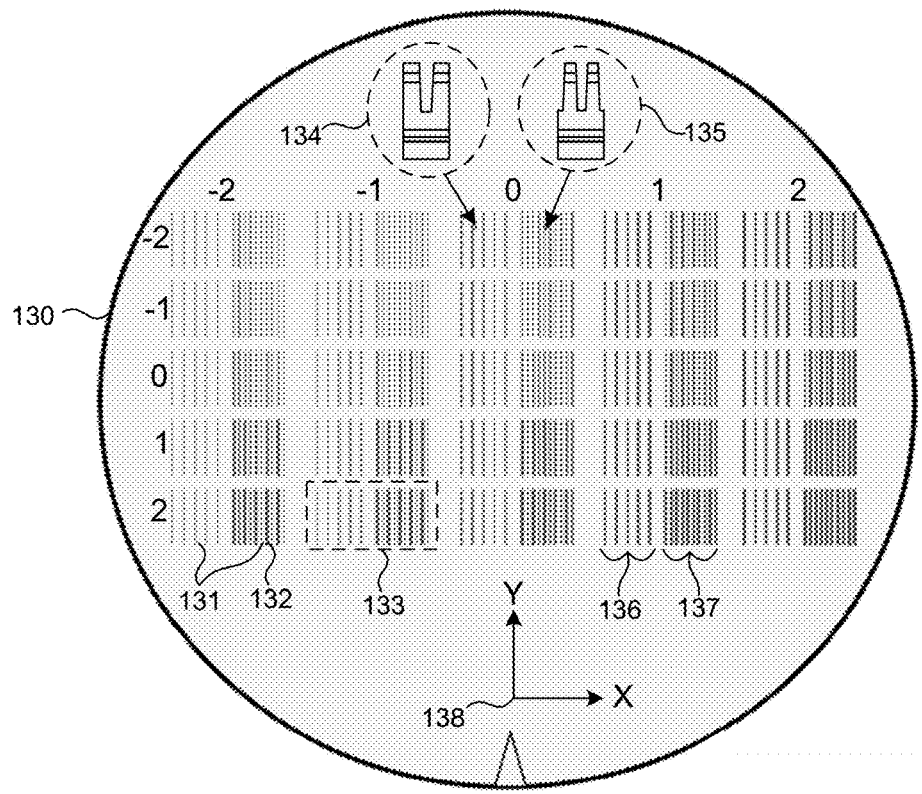
FIG. 5 depicts a semiconductor wafer 130 having a number of die located at various measurement sites over the surface of the wafer, each having different, known structural parameter values.

FIG. 5 depicts a semiconductor wafer 130 having a number of die (e.g., die 133) located at various measurement sites over the surface of the wafer. In the embodiment depicted in FIG. 5, the die are located at measurement sites arranged in a rectangular grid pattern in alignment with the depicted x and y coordinate frame 138. Each die includes a single patterned metrology target (e.g., single patterned metrology target 136) and a multiple patterned metrology target (e.g., multiple patterned metrology target 137). In the embodiment depicted in FIG. 5, each single patterned metrology target includes a set of lines (e.g., the set of lines including line 131) that result from a first patterning step. Each multiple patterned metrology target includes the set of lines that result from the first patterning step along with at least one more set of interposed lines (e.g., the set of lines that include line 142) that result from a subsequent step in the multiple patterning process. As a result, each single patterned metrology target includes a grating structure having a repeated pattern of trench structures such as single patterned unit cell 134. Similarly, each multiple patterned metrology target includes a grating structure having a repeated pattern of trench structures such as multiple patterned unit cell 135.

The geometry of single patterned unit cell 134 is characterized by a critical dimension of the trench structure (CD1) and a depth of the trench structure (TD1), similar to single patterned unit cell 144 depicted in FIG. 7A. The geometry of multiple patterned unit cell 135 is characterized by a critical dimension of the trench structure (CD2) and a depth of the trench structure (TD2), similar to multiple patterned unit cell 145 depicted in FIG. 7B.

Wafer 130 includes an array of die having different, known structural parameter values. Thus, CD1, CD2, TD1, and TD2 have different, known values depending on their location on the wafer 130. In this manner, wafer 130 can be considered a Design of Experiments (DOE) wafer. It is desireable for the DOE wafer to include a matrix of single patterned and multiple patterned metrology targets that span the full range of structural parameter values (e.g., CD1, TD1, CD2, TD2) that are expected to arise from the underlying process window. As depicted in FIG. 5, the values of CD1 change while the values of CD2 remain constant for different columns of die (columns index in the x-direction). Conversely, the values of CD1 remain constant while the values of CD2 change for different rows of die (rows index in the y-direction). In this manner, wafer 130 includes a matrix of die that include different values of CD1 and CD2 depending on their location in the matrix. Moreover, the values of CD1 and CD2 range over the the values of CD1 and CD2 that are expected to arise from the process window.

In some examples, the second amount of measurement data includes two ellipsometric parameters ($\psi, \Delta$) over a spectral range obtained at different measurement sites. In some examples, the second amount of measurement data is associated with actual measurements of the measurement sites on the surface of a DOE wafer (e.g., wafer 130). The measurement data includes spectral measurements associated with the single pattern metrology target and the multiple pattern metrology target associated with each measurement site. In some other examples, the second amount of measurement data is associated with simulations of measurements of the measurement sites on the surface of a DOE wafer (e.g., wafer 130). Similarly, the measurement data includes simulated spectral measurements associated with the single pattern metrology target and the multiple pattern metrology target associated with each measurement site.

Although, in some examples, the measurement data is spectral measurement data, in general, the measurement data may be any measurement data indicative of the structural or geometric properties of the structures patterned onto the surface of a semiconductor wafer.

In block 112, a multi-target model is determined such that the multi-target model captures geometric features of the single patterned metrology target and the multiple patterned metrology target.

The multi-target model includes a parameterization of both the single patterned and multiple patterned metrology targets in terms of the physical properties of each metrology target of interest (e.g., film thicknesses, critical dimensions, refractive indices, grating pitch, etc.). In addition, the model includes a parameterization of the measurement tool itself (e.g., wavelengths, angles of incidence, polarization angles, etc.). In addition, simulation approximations (e.g., slabbing, Rigorous Coupled Wave Analysis (RCWA), etc.) are carefully performed to avoid introducing excessively large errors. Discretization and RCWA parameters are defined.

Machine parameters ($P_{machine}$) are parameters used to characterize the metrology tool itself. Exemplary machine parameters include angle of incidence (AOI), analyzer angle ($A_0$), polarizer angle ($P_0$), illumination wavelength, numerical aperture (NA), etc. Specimen parameters ($P_{specimen}$) are parameters used to characterize the geometric and material properties of the specimen. For a thin film specimen, exemplary specimen parameters include refractive index, dielectric function tensor, nominal layer thickness of all layers, layer sequence, etc.

In many examples, the model parameters are highly correlated, particularly between metrology targets associated with different patterning steps of a multiple patterning process. This can lead to instability of the multi-target model. To address this issue, structural parameter values that capture geometric features of the single patterned metrology target generated by the first patterning step of the multiple patterning process and structural parameter values that capture geometric features of the multiple patterned metrology target generated by the a subsequent patterning step of the multiple patterning process are linked in the combined target model. For example, underlying layers (e.g., oxide base layers of a semiconductor material stack on a semiconductor wafer) are assumed to be uniformly thick over a limited, local area of the wafer surface. Thus, the thickness of the underlying layer in the combined model of both the first metrology target and the second metrology target are assumed to be the same value. In another example, the etch conditions over a limited local area of the wafer surface are assumed to be uniform, thus, the resulting sidewall angle of patterned features within the limited, local area (i.e., the first and second metrology targets) are assumed to be the same.

In another example, the multi-target model includes multiple, different metrology targets, linking the common parameters among them. This helps to reduce correlations, increase sensitivity, and increase robustness to large process variations.

In block 113, the multi-target model is trained based on the second amount of measurement data and the known structural parameter values. A series of simulations, analysis, and regressions are performed to refine the multi-target model and determine which model parameters to float.

In block 114, a first library of measurement data is generated based on simulations of the trained multi-target model for a range of structural parameter values associated with the single patterned metrology target. Similarly, a second library of measurement data is generated based on simulations of the trained multi-target model for a range of structural parameter values associated with the multiple patterned metrology target. In some examples, a library of synthetic spectra is generated based on simulations of the multi-target model for a range of known values of at least one structural parameter of interest (e.g., CD1, CD2, TD1, and TD2).

In block 115, the first and second libraries of measurement values are stored in a memory (e.g., memory 332).

For measurement purposes, the machine parameters of the multi-target model are treated as known, fixed parameters and the specimen parameters of the multi-target model, or a subset of specimen parameters, are treated as unknown, floating parameters. The floating parameters are resolved by a fitting process (e.g., regression, library matching, etc.) that produces the best fit between theoretical predictions and measured data. The unknown specimen parameters, $P_{specimen}$, are varied and the model output values are calculated until a set of specimen parameter values are determined that results in a close match between the model output values and the measured values.

In this manner, at least one structural parameter value indicative of the geometric error induced by the multiple patterning process is determined by fitting the first amount of measurement data to the multi-target model. In some examples, the fitting is based at least in part on the first and second measurement libraries.

In some other examples, the combined measurement model of the single pattern and multiple pattern metrology targets is generated based on raw measurement data (e.g., spectra) only. In this manner, the errors and approximations associated with a detailed geometric model are reduced.

In one further aspect, the combined measurement model is created based only on training data (e.g., simulated spectra or spectra collected from a Design of Experiments (DOE) wafer) collected from measurement sites including single pattern and multiple pattern metrology targets (simulated or actual).

Figure 4:
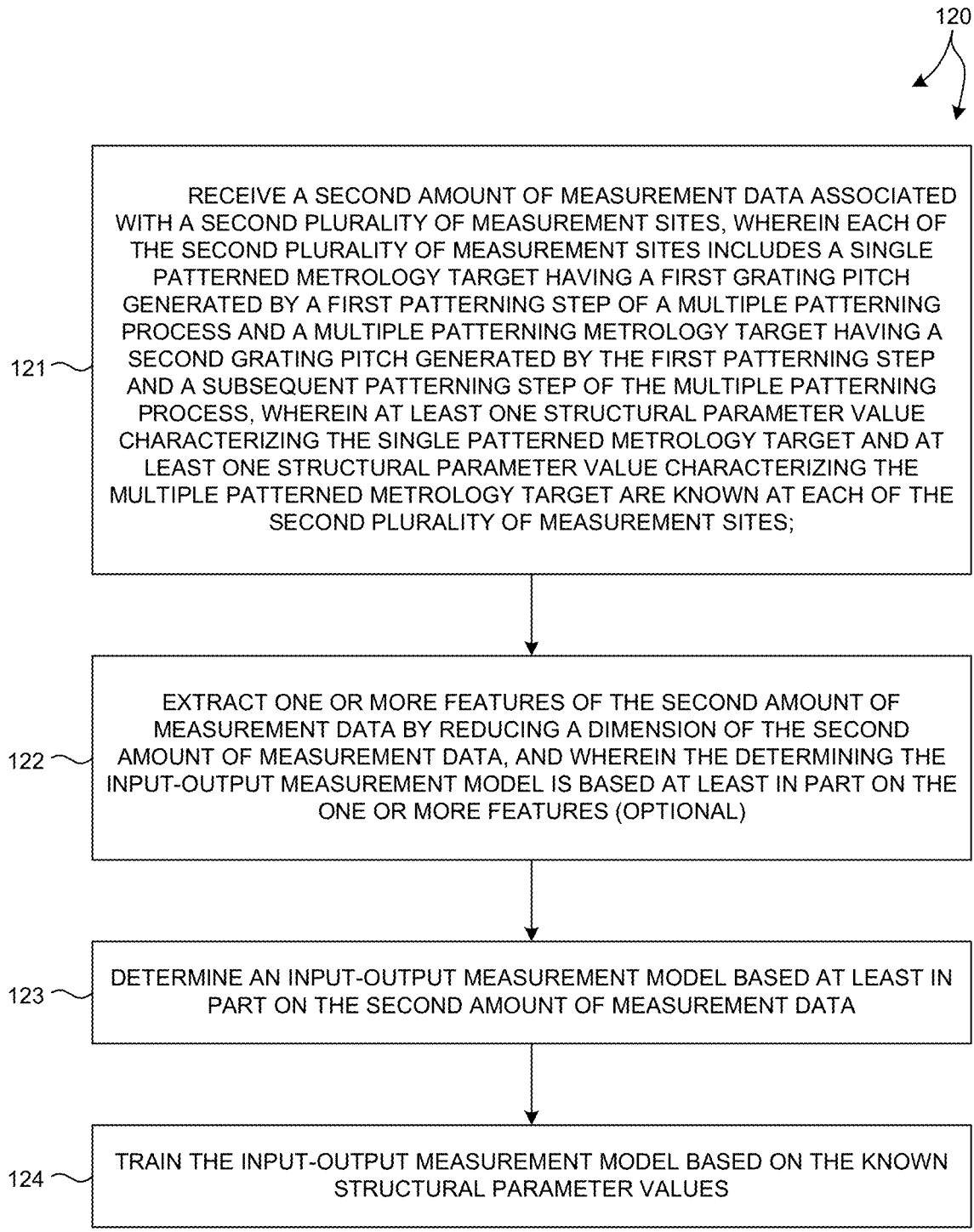
FIG. 4 is a flowchart illustrative of a method 120 of formulating and training a combined model useful to determine one or more parameter values characterizing geometric errors induced by a multiple patterning process.

FIG. 4 illustrates a method 120 suitable for implementation by a metrology system such as metrology system 300 illustrated in FIG. 9 of the present invention. In one aspect, it is recognized that data processing blocks of method 120 may be carried out via a pre-programmed algorithm executed by one or more processors of computing system 330, or any other general purpose computing system. It is recognized herein that the particular structural aspects of metrology system 300 do not represent limitations and should be interpreted as illustrative only.

In block 121, a second amount of measurement data associated with measurements of a second plurality of measurement sites are received by a computing system (e.g., computing system 330). Each of the second plurality of measurement sites includes a single patterned metrology target having a first grating pitch generated by a first patterning step of a multiple patterning process and a multiple patterned metrology target having a second grating pitch generated by the first patterning step and a subsequent patterning step of the multiple patterning process. At least one structural parameter value characterizing the single patterned metrology target and at least one structural parameter value characterizing the multiple patterned metrology target are known at each of the second plurality of measurement sites.

In some examples, the second amount of measurement data is associated with measurements of the second plurality of measurement sites on a Design of Experiments (DOE) wafer and the at least one structural parameter value characterizing the first metrology target and the second metrology target is measured by a reference measurement system at each of the second plurality of measurement sites. The reference metrology system is a trusted metrology system such as a Scanning Electron Microscope (SEM), Tunneling electron Microscope (TEM), Atomic Force Microscope (AFM), or x-ray measurement system that is able to accurately measure the structural parameter value.

In some embodiments, structural parameter variations are organized in a Design of Experiments (DOE) pattern on the surface of a semiconductor wafer (e.g., DOE wafer), for example, as described herein with reference to FIG. 5. In this manner, the measurement system interrogates different locations on the wafer surface that correspond with different structural parameter values. In the example described with reference to FIG. 5, the measurement data is associated with a DOE wafer processed with known variations in CD1 and CD2. However, in general, measurement data associated with any known variation of process parameters, structural parameter, or both, may be contemplated.

For purposes of model training, additional measurement data may be acquired from other locations with known perturbations in the design parameters, e.g., structure or process parameters. These locations, for example, may be in the scribe line, on-device, or may be at other locations on the wafer where, for example, lithographic exposure conditions or reticle design characteristics vary over a range of values. In another example, measurement data may be acquired from different device locations (e.g., a location with dense features and a location with isolated features, or locations with two different CDs on mask). In general, the measurement data is acquired from different locations that are perturbed in a known way. The perturbation may be known from mask data, Equipment Data Acquisition (EDA) data, process data, etc.

The set of systematic variations is commonly termed a design of experiments (DOE). In one example, any of focus, exposure, and overlay are varied systematically across the device or the wafer. In another example, a randomized Focus and Exposure Matrix (FEM) is employed to reduce correlation with underlayer parameters as described in U.S. Pat. No. 8,142,966 to Izikson et al., the entirety of which is incorporated herein by reference.

In a preferred embodiment, the set of systematic variations is implemented in the fabrication of an actual DOE wafer. The DOE wafer is subsequently measured to generate the measurement data received in block 121. A manufactured wafer includes systematic errors which cannot be easily modeled by simulation. For example, the effect of underlayers is more accurately captured by measurements of a real wafer. The underlayer contribution can be decorrelated from the measurement responses by modifying process parameters during manufacture, e.g., focus and exposure variations, for a fixed underlayer condition. In another example, the underlayer contribution can be mitigated by taking multiple data sets from features with varying top layer topography and constant underlayer conditions. In one example, the top layer may include a periodic structure and the underlayer may be non-periodic.

Measurement locations may be selected to increase measurement sensitivity. In one example, measurements performed at line ends are most sensitive to changes in focus. In general, measurements should be taken at structures that are most sensitive to changes in the parameter to be measured.

Although it is preferred to perform actual measurements of DOE wafers, in some other examples the measurement response of a DOE wafer for different, known structural parameter values may be simulated. In these examples, the measurement data received in block 121 is synthetically generated. For example, a process simulator such as the Positive Resist Optical Lithography (PROLITH) simulation software available from KLA-Tencor Corporation, Milpitas, Calif. (USA) may be employed. In general, any process modeling technique or tool may be contemplated within the scope of this patent document (e.g., Coventor simulation software available from Coventor, Inc., Cary, N.C., USA).

In block 122, one or more features of the second amount of measurement data is extracted by reducing a dimension of the second amount of measurement data. Although, this block is optional, when it is employed, the input-output measurement model is determined based at least in part on the one or more extracted features.

In general, the dimension of the second amount of measurement data may be reduced by a number of known methods, including a principal components analysis, a non-linear principal components analysis, a selection of individual signals from the second amount of measurement data, and a filtering of the second amount of measurement data.

In some examples, the measurement data is analyzed using Principal Components Analysis (PCA), or non-linear PCA, to extract features that most strongly reflect the variations in process parameter, structural parameters, or both, that are present at the different measurement sites. In some other examples, a signal filtering technique may be applied to extract signal data that most strongly reflects the parameter variations present at the different measurement sites. In some other examples, individual signals that most strongly reflect the parameter variations present at the different measurement sites may be selected from multiple signals present in the measurement data. Although, it is preferred to extract features from the measurement data to reduce the dimension of data subject to subsequent analysis, it is not strictly necessary. In this sense, block 122 is optional.

In block 123, the input-output measurement model is determined based at least in part on the second amount of measurement data.

An input-output measurement model is determined based on features extracted from the measurement data, or alternatively, directly from the measurement data. The input-output measurement model is structured to receive measurement data generated by a metrology system at one or more measurement sites, and directly determine structural parameter values associated with each measurement target. In a preferred embodiment, the input-output measurement model is implemented as a neural network model. In one example, the number of nodes of the neural network is selected based on the features extracted from the measurement data. In other examples, the input-output measurement model may be implemented as a polynomial model, a response surface model, or other types of models.

In block 124, the input-output measurement model is trained based on known structural parameter values. In some examples, the trained input-output measurement model is generated using DOE measurement data and known structural parameter values. The model is trained such that its output fits the defined expected response for all the spectra in the process variation space defined by the DOE spectra.

In some examples, the trained, input-output model is used to calculate structure parameter values directly from measured data (e.g., spectra) collected from actual device structures of other wafers (e.g., product wafers) as described herein with reference to method 100. In this manner, only spectra acquired from known samples or synthetically generated spectra is required to create a measurement model and to perform measurements using the model. A combined measurement model formulated in this manner receives measurement data (e.g., measured spectra) directly as input and provides structure parameter values as output, and is thus, a trained input-output model.

Additional details related to model generation, training, and utilization as part of the measurement process are described in U.S. Pat. No. 8,843,875 to Pandev, U.S. Patent Publication No. 2014/0297211 by Pandev et al., and U.S. Patent Publication No. 2014/0316730 by Shchegrov et al., the entirety of each are incorporated herein by reference.

Figure 8A:
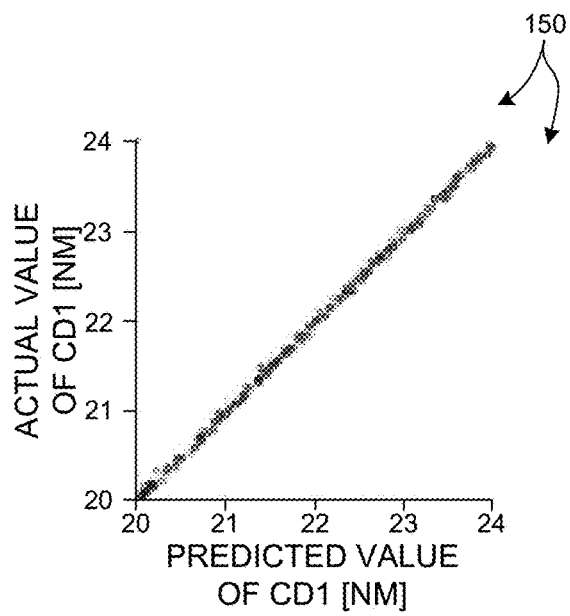
FIGS. 8A-8D illustrate plots 150-153, respectively, demonstrating the results of measuring a number of structural parameters indicative of geometric errors induced by a multiple patterning process.
Figure 8B:
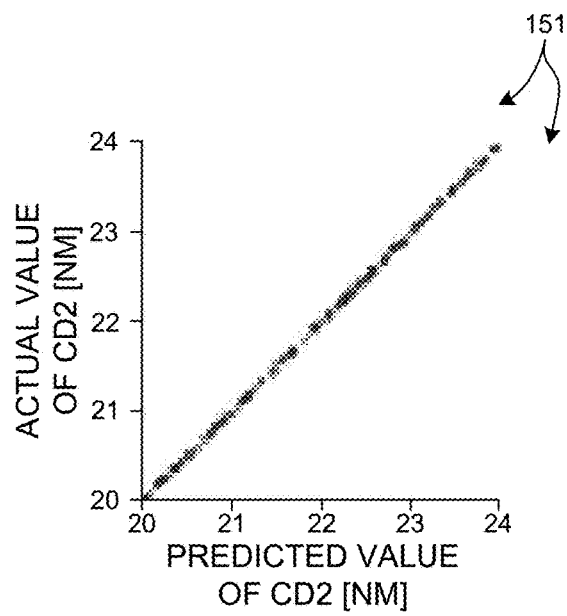
Figure 8C:
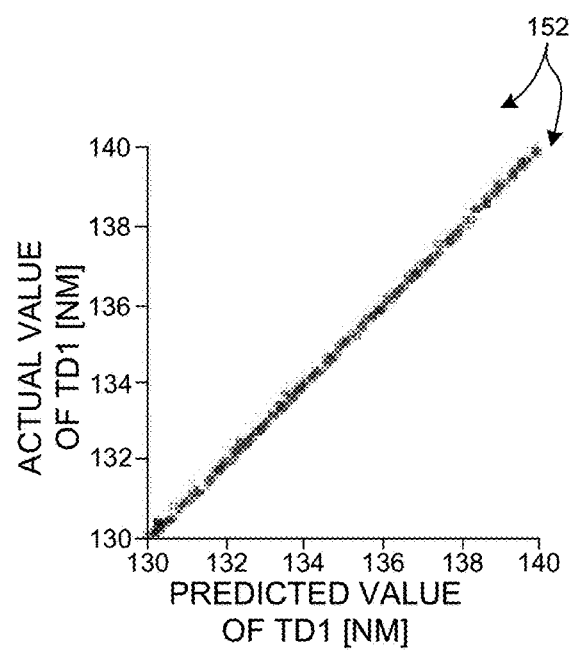
Figure 8D:
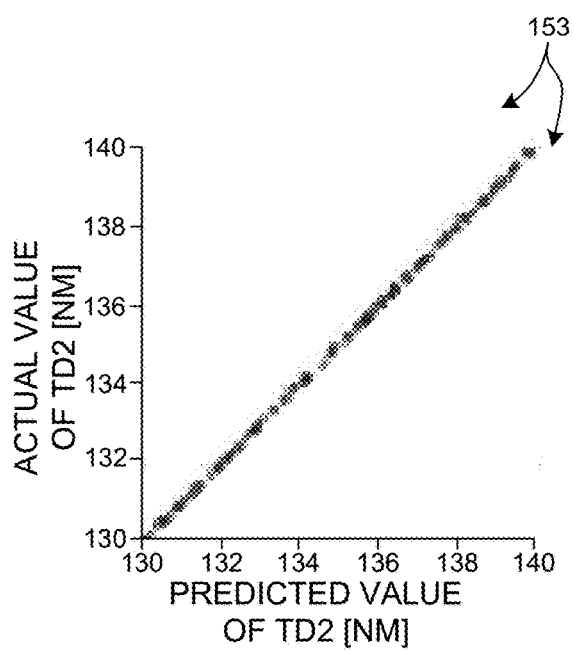

FIGS. 8A-8D illustrate plots 150-153, respectively, demonstrating the results of measuring CD1, CD2, TD1, and TD2, respectively. DOE spectra were generated synthetically for different values of CD1, CD2, TD1, and TD2 in the presence of variations of other geometric parameter values. FIG. 8A illustrates the model fit of the predicted CD1 value in nanometers to the actual CD1 value used to generate the synthetic spectra. FIG. 8B illustrates the model fit of the predicted CD2 value in nanometers to the actual CD2 value used to generate the synthetic spectra. FIG. 8C illustrates the model fit of the predicted TD1 value in nanometers to the actual TD1 value used to generate the synthetic spectra. FIG. 8D illustrates the model fit of the predicted TD2 value in nanometers to the actual TD2 value used to generate the synthetic spectra. As illustrated, the sigma values associated with the residual errors are less than 0.1 nanometers in magnitude.

FIG. 9 illustrates a system 300 for measuring characteristics of a specimen in accordance with the exemplary methods presented herein. As shown in FIG. 9, the system 300 may be used to perform spectroscopic ellipsometry measurements of one or more structures of a specimen 301. In this aspect, the system 300 may include a spectroscopic ellipsometer equipped with an illuminator 302 and a spectrometer 304. The illuminator 302 of the system 300 is configured to generate and direct illumination of a selected wavelength range (e.g., 150-2000 nm) to the structure disposed on the surface of the specimen 301. In turn, the spectrometer 304 is configured to receive illumination reflected from the surface of the specimen 301. It is further noted that the light emerging from the illuminator 302 is polarized using a polarization state generator 307 to produce a polarized illumination beam 306. The radiation reflected by the structure disposed on the specimen 301 is passed through a polarization state analyzer 309 and to the spectrometer 304. The radiation received by the spectrometer 304 in the collection beam 308 is analyzed with regard to polarization state, allowing for spectral analysis by the spectrometer of radiation passed by the analyzer. These spectra 311 are passed to the computing system 330 for analysis of the structure.

As depicted in FIG. 9, system 300 includes a single measurement technology (i.e., SE). However, in general, system 300 may include any number of different measurement technologies. By way of non-limiting example, system 300 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, rather than one tool integrating multiple technologies.

In a further embodiment, system 300 may include one or more computing systems 330 employed to perform measurements based on measurement models developed in accordance with the methods described herein. The one or more computing systems 330 may be communicatively coupled to the spectrometer 304. In one aspect, the one or more computing systems 330 are configured to receive measurement data 311 associated with measurements of the structure of specimen 301.

It should be recognized that the various steps described throughout the present disclosure may be carried out by a single computer system 330 or, alternatively, a multiple computer system 330. Moreover, different subsystems of the system 300, such as the spectroscopic ellipsometer 304, may include a computer system suitable for carrying out at least a portion of the steps described herein. Therefore, the aforementioned description should not be interpreted as a limitation on the present invention but merely an illustration. Further, the one or more computing systems 330 may be configured to perform any other step(s) of any of the method embodiments described herein.

In addition, the computer system 330 may be communicatively coupled to the spectrometer 304 in any manner known in the art. For example, the one or more computing systems 330 may be coupled to computing systems associated with the spectrometer 304. In another example, the spectrometer 304 may be controlled directly by a single computer system coupled to computer system 330.

The computer system 330 of the metrology system 300 may be configured to receive and/or acquire data or information from the subsystems of the system (e.g., spectrometer 304 and the like) by a transmission medium that may include wireline and/or wireless portions. In this manner, the transmission medium may serve as a data link between the computer system 330 and other subsystems of the system 300.

Computer system 330 of the integrated metrology system 300 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 330 and other systems (e.g., memory on-board metrology system 300, external memory, reference measurement source 320, or other external systems). For example, the computing system 330 may be configured to receive measurement data from a storage medium (i.e., memory 332 or an external memory) via a data link. For instance, spectral results obtained using spectrometer 304 may be stored in a permanent or semi-permanent memory device (e.g., memory 332 or an external memory). In this regard, the spectral results may be imported from on-board memory or from an external memory system. Moreover, the computer system 330 may send data to other systems via a transmission medium. For instance, a combined measurement model or a structural parameter value 340 determined by computer system 330 may be communicated and stored in an external memory. In this regard, measurement results may be exported to another system.

Computing system 330 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Figure 12:
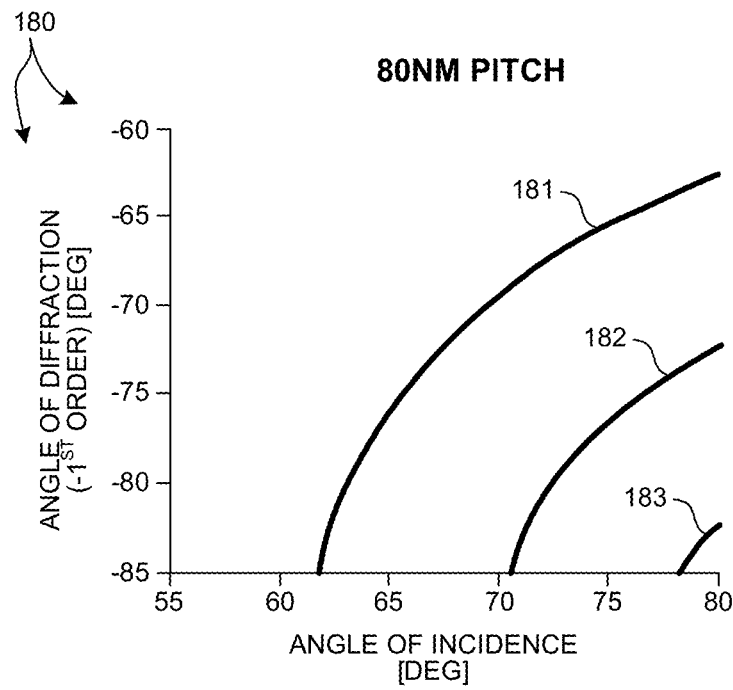
FIG. 12 illustrates a plot 180 of the resulting angles of diffraction associated with $-1^{st}$ order diffraction from a grating having a 80 nanometer pitch for a range of angles of incidence.

Program instructions 334 implementing methods such as those described herein may be transmitted over a transmission medium such as a wire, cable, or wireless transmission link. For example, as illustrated in FIG. 12, program instructions 334 stored in memory 332 are transmitted to processor 331 over bus 333. Program instructions 334 are stored in a computer readable medium (e.g., memory 332). Exemplary computer-readable media include read-only memory, a random access memory, a magnetic or optical disk, or a magnetic tape.

Figure 10:
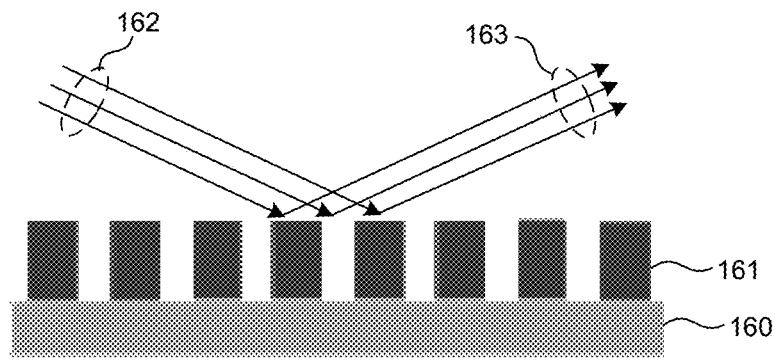
FIG. 10 depicts a patterned layer 161 disposed over an underlayer 160 of a semiconductor wafer. In the depicted embodiment, the patterned layer 161 is a grating structure having uniform pitch.

FIG. 10 depicts a patterned layer 161 disposed over an underlayer 160 of a semiconductor wafer. In the depicted embodiment, the patterned layer 161 is a grating structure having uniform pitch. In addition, oblique illumination light 162 is incident on patterned layer 161, and light 163 is diffracted from patterned layer 161. When the grating structure of patterned layer 161 is perfectly uniform, as depicted in FIG. 10, the light diffracted from patterned layer 161 is zero order diffracted light only. Thus, for an ideal structure constructed by a multiple patterning process ($\Delta CD=0$ and pitch walk=0), only $0^{th}$ diffraction order is present for all angles of incidence and wavelengths available for optical scatterometry.

Figure 11:
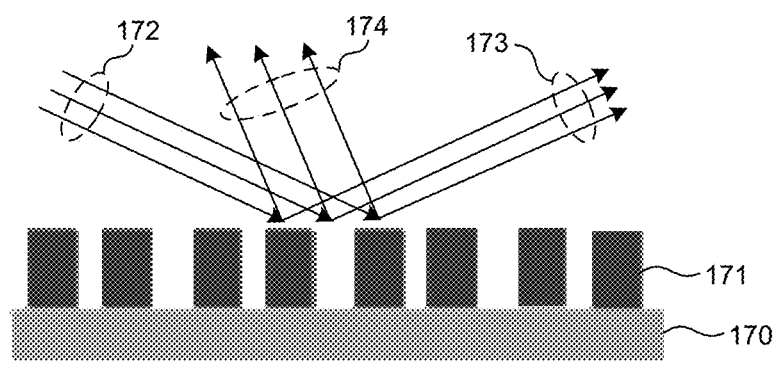
FIG. 11 depicts a patterned layer 171 disposed over an underlayer 170 of a semiconductor wafer. In the depicted embodiment, the patterned layer 171 is a grating structure having non-uniform pitch.

FIG. 11 depicts a patterned layer 171 disposed over an underlayer 170 of a semiconductor wafer. In the depicted embodiment, the patterned layer 171 is a grating structure having non-uniform pitch. In addition, oblique illumination light 172 is incident on patterned layer 171. When the grating structure of patterned layer 171 is non-uniform, as depicted in FIG. 11, the light diffracted from patterned layer 171 includes multiple diffraction orders. Multiple patterning errors create grating patterns having non-uniform pitch. Hence, the effective unit cell of these patterns is much larger as well as the structure period. This enables higher diffraction orders (e.g., first order or negative first order) to become propagating. As depicted in FIG. 11, the light diffracted from non-uniform patterned layer 171 includes zero order diffracted light 173 and first order diffracted light 174. Depending on the sign convention employed, first order diffracted light 174 may be considered diffracted light having a grating order of one or negative one.

Typical semiconductor metrology, such as spectroscopic ellipsometry, involves the collection and analysis of zero order diffracted light. However, in another aspect, diffracted light having a diffraction order different from zero is collected and analyzed to determine the value of at least one structural parameter that is indicative of a geometric error induced by a multiple patterning process. In some embodiments, a single diffraction order different from zero (e.g., −1 or 1) is collected and analyzed to determine the value of at least one structural parameter that is indicative of a geometric error induced by a multiple patterning process.

The relation between the angle of incidence and the 0th order angle is given by equation (1), where $\theta_{AOI}$ is the angle of incidence of the illumination light and $\theta_{0th}$ is the angle of the 0th order.

$$\theta_{AOI} = -\theta_{0th} \tag{1}$$

The numerical aperture of the $-1^{st}$ order is related to the numerical aperture of the $0^{th}$ order, the wavelength of the illumination light, $\lambda$, and the pitch of the grating structure, P, as given by equation (2).

$$NA_{-1st} = NA_{0th} - \frac{\lambda}{P} \tag{2}$$

FIG. 12 illustrates a plot 180 of the resulting angles of diffraction associated with $-1^{st}$ order diffraction from a grating having a 80 nanometer pitch for a range of angles of incidence. Plotline 181 is associated with illumination light having a wavelength of 150 nanometers. Plotline 182 is associated with illumination light having a wavelength of 155 nanometers. Plotline 183 is associated with illumination light having a wavelength of 158 nanometers.

Figure 13:
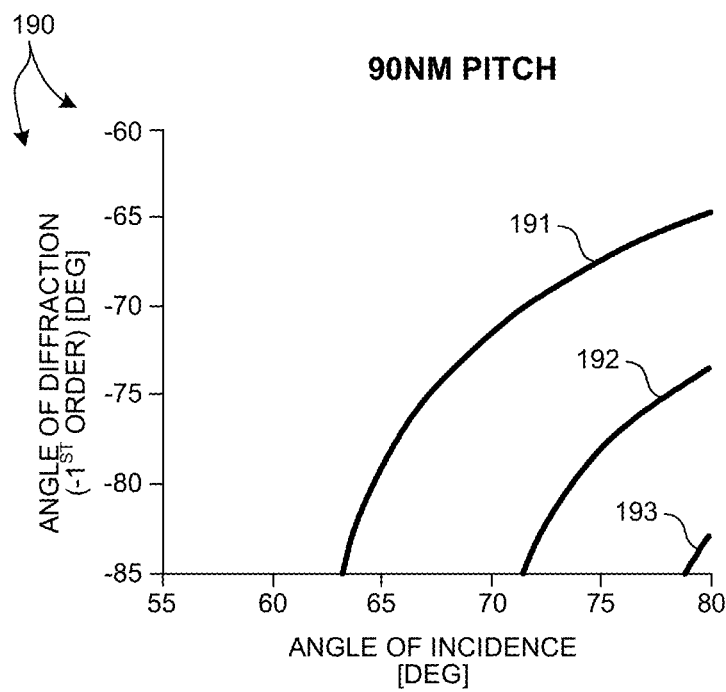
FIG. 13 illustrates a plot 190 of the resulting angles of diffraction associated with $-1^{st}$ order diffraction from a grating having a 90 nanometer pitch for a range of angles of incidence.

FIG. 13 illustrates a plot 190 of the resulting angles of diffraction associated with $-1^{st}$ order diffraction from a grating having a 90 nanometer pitch for a range of angles of incidence. Plotline 191 is associated with illumination light having a wavelength of 170 nanometers. Plotline 192 is associated with illumination light having a wavelength of 175 nanometers. Plotline 193 is associated with illumination light having a wavelength of 178 nanometers.

Figure 14:
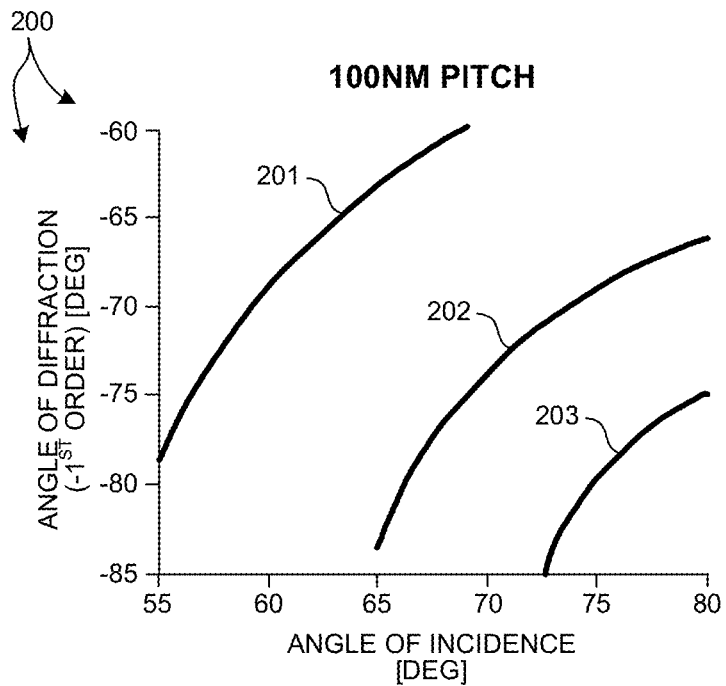
FIG. 14 illustrates a plot 200 of the resulting angles of diffraction associated with $-1^{st}$ order diffraction from a grating having a 100 nanometer pitch for a range of angles of incidence.

FIG. 14 illustrates a plot 200 of the resulting angles of diffraction associated with $-1^{st}$ order diffraction from a grating having a 100 nanometer pitch for a range of angles of incidence. Plotline 201 is associated with illumination light having a wavelength of 180 nanometers. Plotline 202 is associated with illumination light having a wavelength of 190 nanometers. Plotline 203 is associated with illumination light having a wavelength of 195 nanometers.

Figure 15:
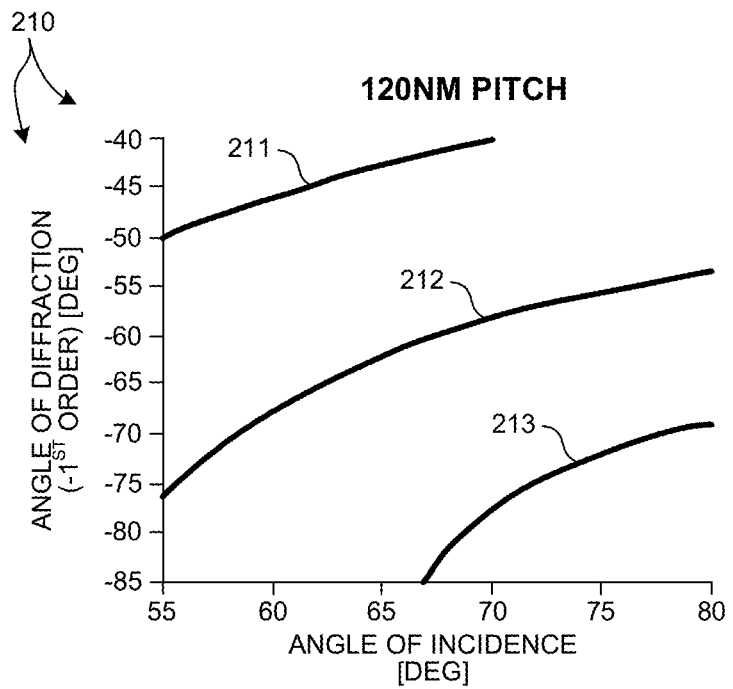
FIG. 15 illustrates a plot 210 of the resulting angles of diffraction associated with $-1^{st}$ order diffraction from a grating having a 120 nanometer pitch for a range of angles of incidence.

FIG. 15 illustrates a plot 210 of the resulting angles of diffraction associated with $-1^{st}$ order diffraction from a grating having a 120 nanometer pitch for a range of angles of incidence. Plotline 211 is associated with illumination light having a wavelength of 190 nanometers. Plotline 212 is associated with illumination light having a wavelength of 215 nanometers. Plotline 213 is associated with illumination light having a wavelength of 230 nanometers.

As illustrated by FIGS. 12-15, optical scatterometry systems operating at relatively high numerical aperture (e.g., NA=0.9) with illumination wavelengths down to 170 nanometers are able to detect pitch walk at a 90 nanometer fundamental pitch over a broad range of diffraction angles associated with the $-1^{st}$ diffraction order. Similarly, optical scatterometry systems operating at relatively high numerical aperture (e.g., NA=0.9) with illumination wavelengths down to 150 nanometers are able to detect pitch walk at a 80 nanometer fundamental pitch over a broad range of diffraction angles associated with the $-1^{st}$ diffraction order.

Figure 16:
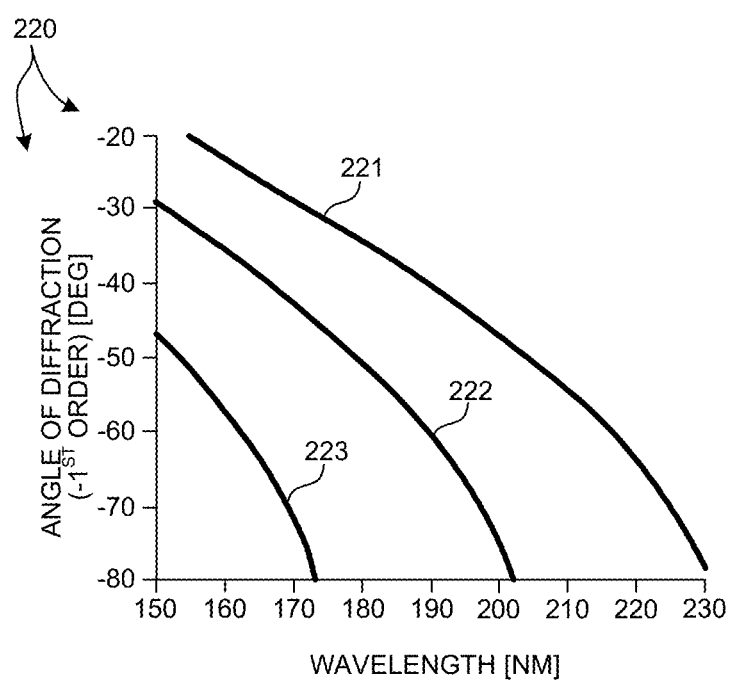
FIG. 16 illustrates a plot 220 of the resulting angles of diffraction associated with $-1^{st}$ order diffraction for a fixed angle of incidence (70 degrees) over a range of illumination wavelengths.

FIG. 16 illustrates a plot 220 of the resulting angles of diffraction associated with $-1^{st}$ order diffraction for a fixed angle of incidence (70 degrees) over a range of illumination wavelengths. Plotline 221 is associated with a grating having a pitch of 120 nanometers. Plotline 222 is associated with a grating having a pitch of 105 nanometers. Plotline 223 is associated with a grating having a pitch of 90 nanometers.

As illustrated by FIG. 16, the $-1^{st}$ diffraction order can be detected in an oblique-angle spectroscopic system such as the Aleris® family of metrology tools available from KLA-Tencor Corporation, Milpitas, Calif. (USA).

Figure 17:
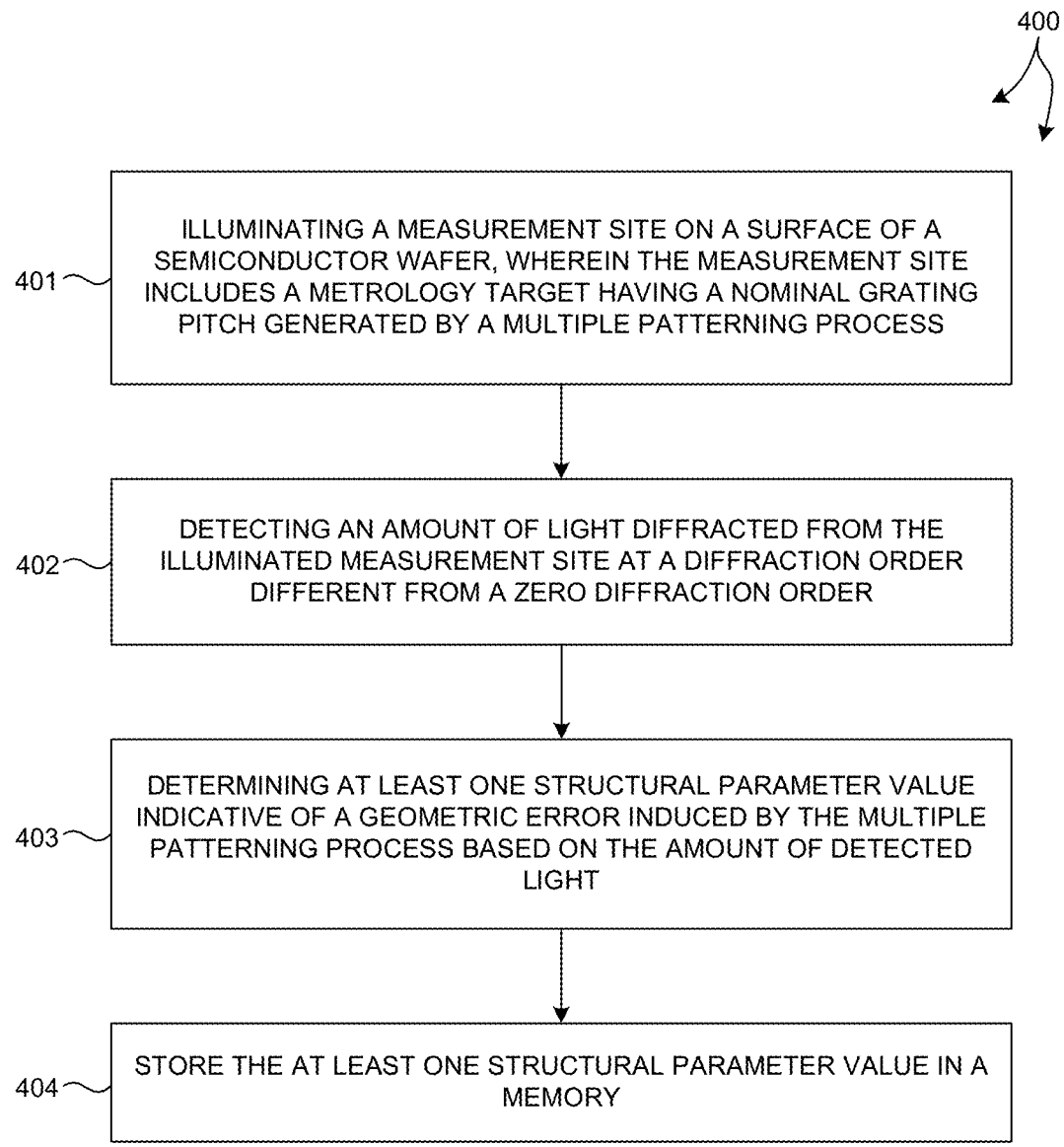
FIG. 17 illustrates a method 400 suitable for implementation by a metrology system such as metrology systems 500, 600, and 700 illustrated in FIGS. 18, 19, and 20, respectively, of the present invention.
Figure 18:
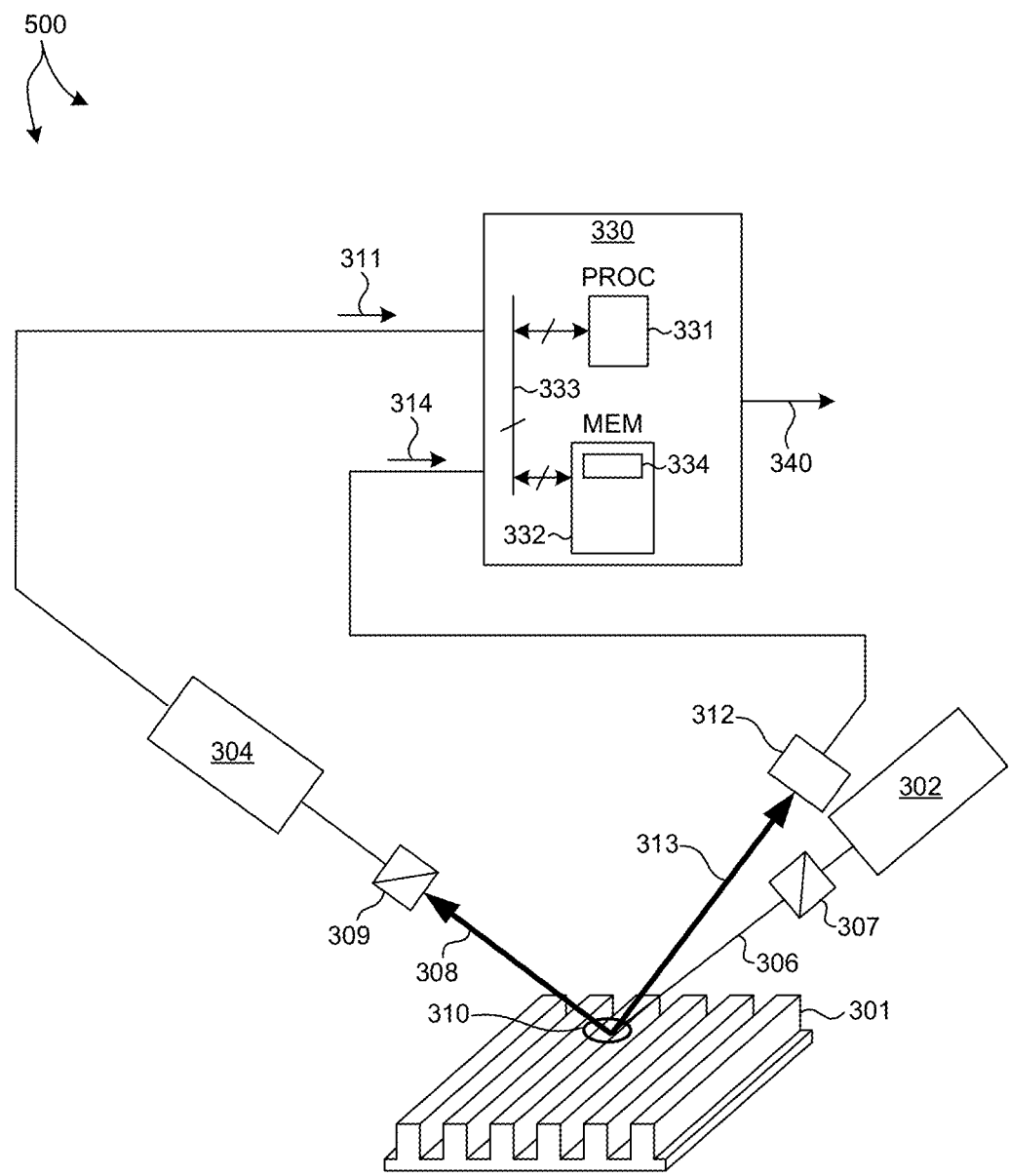
FIG. 18 illustrates a metrology system 500 for measuring characteristics of a specimen in accordance with the exemplary methods presented herein
Figure 19:
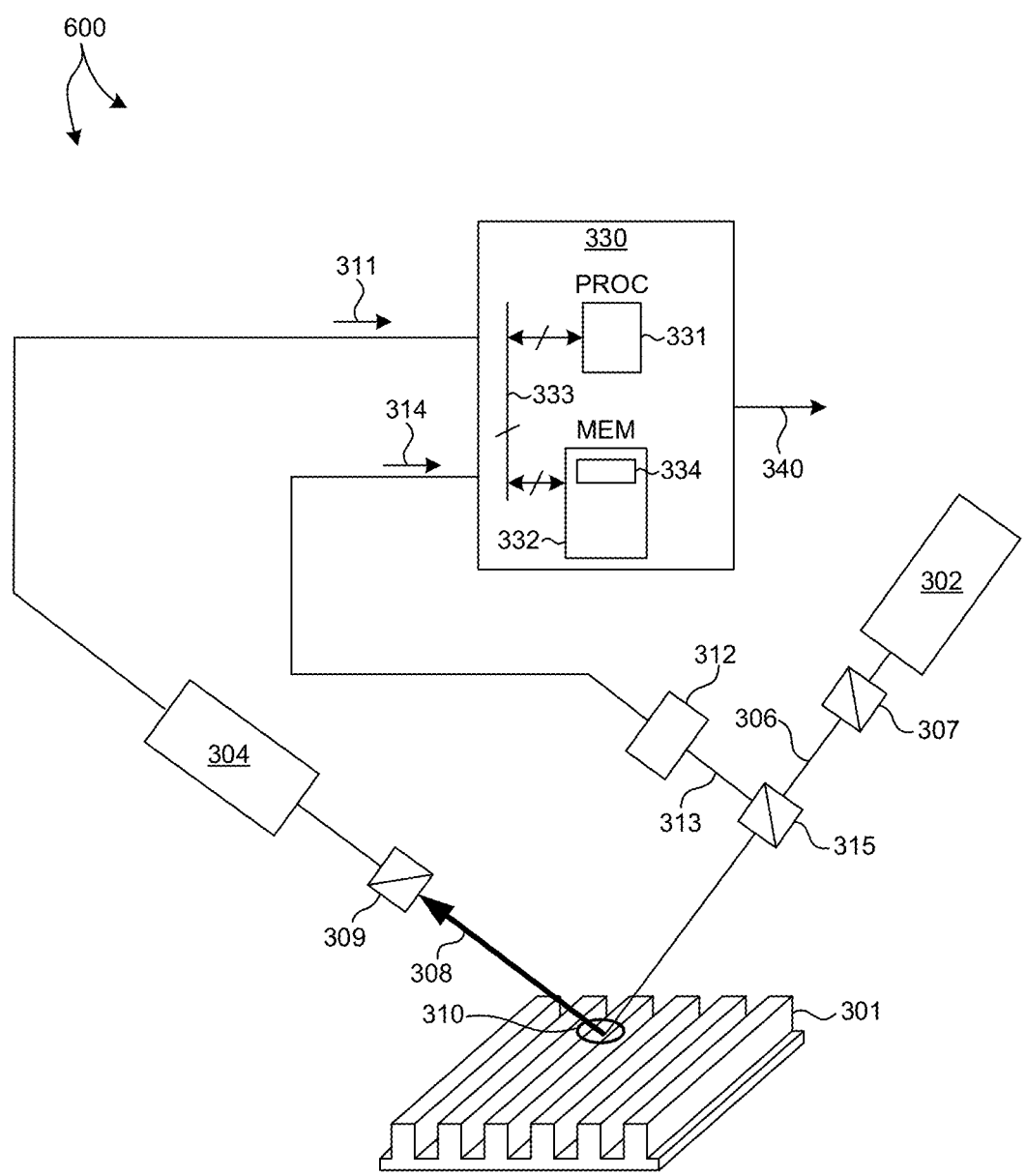
FIG. 19 illustrates a metrology system 600 for measuring characteristics of a specimen in accordance with the exemplary methods presented herein.
Figure 20:
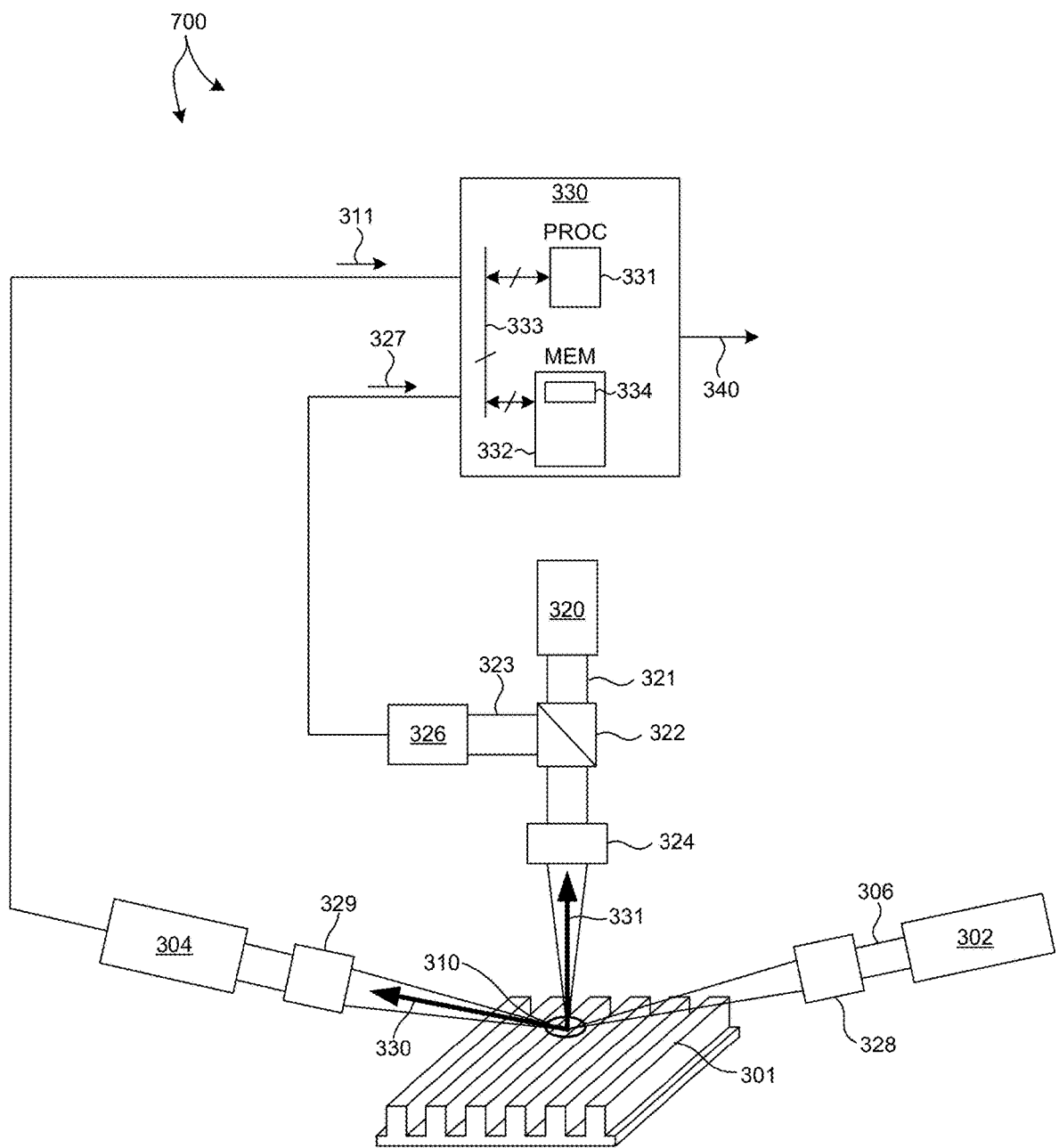
FIG. 20 illustrates a metrology system 700 for measuring characteristics of a specimen in accordance with the exemplary methods presented herein.

FIG. 17 illustrates a method 400 suitable for implementation by a metrology system such as metrology systems 500, 600, and 700 illustrated in FIGS. 18, 19, and 20, respectively, of the present invention. In one aspect, it is recognized that data processing blocks of method 400 may be carried out via a pre-programmed algorithm executed by one or more processors of computing system 330, or any other general purpose computing system. It is recognized herein that the particular structural aspects of metrology systems 500, 600, and 700 do not represent limitations and should be interpreted as illustrative only.

In block 401, a measurement site on a surface of a semiconductor wafer is illuminated. The measurement site includes a metrology target having a nominal grating pitch generated by a multiple patterning process. In some embodiments, illumination light having multiple, different wavelengths is provided to the measurement site. In some embodiments, illumination light is provided to the measurement site at multiple, different angles of incidence. By providing illumination light at multiple wavelengths and angles of incidence, measurement sensitivity to pitch walk and variation in critical dimensions (e.g., ΔCD) is improved.

In some embodiments, the metrology target has a different pitch than a corresponding nominal device structure. For example, if the metrology system lacks sufficient sensitivity to errors induced by multiple patterning (e.g., pitch walk, critical dimension variation, etc.) the pitch of a corresponding metrology target may be selected to be larger by a known amount. The pitch of the metrology target is selected to be well within the sensitivity range of the metrology tool. In this manner, the metrology target functions as a proxy for the nominal device structure.

In some embodiments, the metrology target has a nominal grating structure that includes variations in pitch. However, a corresponding nominal device structure has a nominal grating structure with uniform pitch. As described hereinbefore, gratings having perfectly uniform pitch will exhibit zero order diffraction, but will not exhibit higher order diffraction. In some embodiments, the metrology system is configured to detect higher order diffraction (e.g., the $-1^{st}$ order), but light diffracted at zero order will fall outside of the collection pupil. Hence, the metrology system will be effectively blind to metrology targets exhibiting perfectly uniform pitch, and will have limited sensitivity to metrology targets exhibiting relatively variations in pitch. Thus, in some embodiments, it is desireable to introduce known variations in the pitch of the metrology target when the pitch of the corresponding nominal device structure is perfectly uniform. In this manner, higher order diffraction will occur from the metrology target even when the corresponding device structure is perfectly constructed (i.e., exhibiting uniform pitch). In this manner, the response of the metrology system to the known variations in the pitch of the metrology target will be indicative of the pitch uniformity of corresponding device structures.

Figure 24:
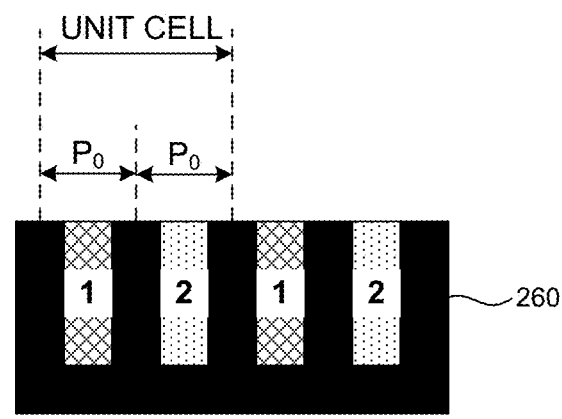
FIG. 24 illustrates a nominal device structure 260 generated by two patterning steps that are performed perfectly.

FIG. 24 illustrates a nominal device structure 260 generated by two patterning steps. As depicted in FIG. 24, a first set of trenches, denoted with the numeral 1, are fabricated as part of a first patterning step. In the depicted embodiment, this results in a grating having a pitch equal to $2*P_0$. In a subsequent patterning step, a second set of trenches, denoted with the numeral 2, are fabricated. In the depicted example, the patterning steps are performed perfectly, and the resulting pitch of the grating structure is uniform, and equal to $P_0$.

Figure 25:
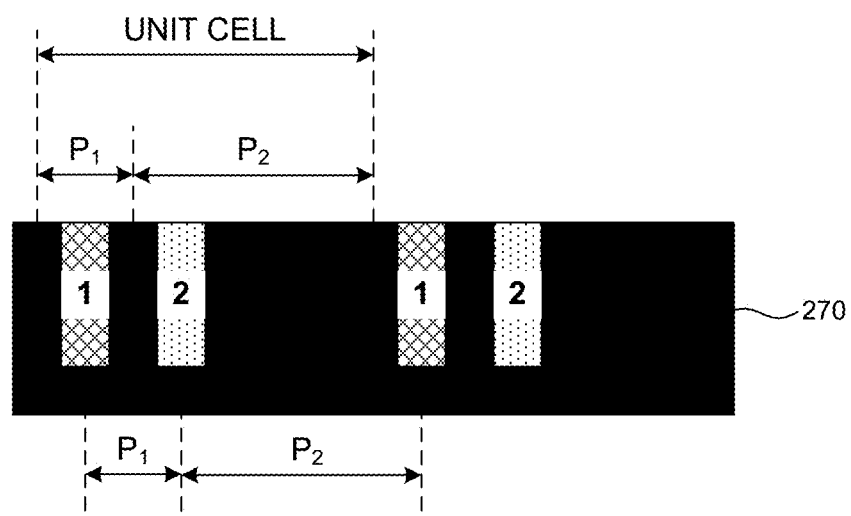
FIG. 25 illustrates a metrology target 270 that corresponds to the nominal device structure 260 depicted in FIG. 24. Metrology target 270 is designed with a relatively large variation in pitch to enhance measurement sensitivity based on measurements of light diffracted at orders different from zero order.

FIG. 25 illustrates a metrology target 270 that corresponds to the nominal device structure 260. In other words, metrology target 270 acts as an assist structure, or proxy structure designed to facilitate, or substitute for the measurement of the device structure 260. Measured parameters of metrology target 270 are indicative of corresponding parameters of the device structure 260. In one further aspect, metrology target 270 is designed with a relatively large variation in pitch to enhance measurement sensitivity based on measurements of light diffracted at orders different from zero order. As depicted in FIG. 25, a first set of trenches, denoted with the numeral 1, are fabricated as part of the first patterning step. In the depicted embodiment, this results in a grating having a pitch equal to $P_1+P_2$. In a subsequent patterning step, a second set of trenches, denoted with the numeral 2, are fabricated. In the depicted example, the patterning steps are performed perfectly, and the resulting pitch of the grating structure is non-uniform, and includes two different pitches, $P_1$ and $P_2$.

In some other embodiments, the metrology target has a nominal grating structure with uniform pitch (i.e., a perfectly constructed metrology target has uniform pitch), and a corresponding nominal device structure also has a nominal grating structure with uniform pitch. As described hereinbefore, gratings having perfectly uniform pitch will exhibit zero order diffraction, but will not exhibit higher order diffraction. In some embodiments, the metrology system is configured to detect higher order diffraction (e.g., the $-1^{st}$ order), but light diffracted at zero order will fall outside of the collection pupil. Hence, the metrology system will be blind to metrology targets exhibiting perfectly uniform pitch. Thus, in some embodiments, it is desireable to introduce a known offset into the overlay associated with the metrology target compared to the overlay associated with the corresponding nominal device structure. In this manner, higher order diffraction will occur from the metrology target due to the offset in overlay even when the corresponding nominal device structure is perfectly constructed (i.e., using the correct nominal overlay). In this manner, the response of the metrology system to the known offset in overlay associated with the metrology target will be indicative of the pitch uniformity of corresponding nominal device structures.

In general, either, or both, the metrology targets and the nominal device structures may be located in a scribe line of a semiconductor wafer or within a functional die area of the semiconductor wafer.

In block 402, an amount of light diffracted from the illuminated measurement site at a diffraction order that is different from the zero diffraction order is detected. In some embodiments, the light diffracted from the illuminated measurement site includes multiple, different wavelengths. In some embodiments, the light diffracted from the illuminated measurement site is collected at multiple, different collection angles. By detecting diffracted light at multiple wavelengths and angles of collection, measurement sensitivity to pitch walk and variation in critical dimensions (e.g., ΔCD) is improved. In some embodiments, the light diffracted from the illuminated measurement site is collected at multiple, different azimuthal angles. These out-of-plane measurements may also improve measurement sensitivity to pitch walk and variations in critical dimensions.

In block 403, at least one structural parameter value indicative of a geometric error induced by the multiple patterning process is determined based on the amount of detected light.

In some embodiments, a direct analysis of the detected light will indicate the geometric errors induced by multiple patterning. For example, evaluating the signal intensity at different locations on the detector will indicate the presence of multiple, different pitches, and their magnitude. In some examples, nothing is detected, and thus, one can assume that all of the light is diffracted at zero order, and thus, perfectly uniform pitch has been achieved.

In some other embodiments, a model based analysis of the detected light is employed to predict the values of structural parameters that indicate the geometric errors induced by multiple patterning. For example, the model based methods described herein may be employed to analyze diffraction measurements at diffraction orders different from the zero diffraction order.

In block 404, the at least one structural parameter value is stored in a memory (e.g., memory 332).

FIG. 18 illustrates a metrology system 500 for measuring characteristics of a specimen in accordance with the exemplary methods presented herein. Metrology system 500 includes like numbered elements described with reference to FIG. 9. However, in addition, metrology system 500 includes a detector 312 located on the same side as the illumination. Detector 312 is configured to collect light 313 diffracted from measurement site 310 at the $-1^{st}$ diffraction order. Signals 314 indicative of the light detected by detector 312 are communicated to computing system 330 for analysis. As such, system 500 is configured to provide oblique illumination to one or more structures of a specimen 301 and detect light diffracted from specimen 301 at the $-1^{st}$ diffraction order.

FIG. 19 illustrates a metrology system 600 for measuring characteristics of a specimen in accordance with the exemplary methods presented herein. Metrology system 600 includes like numbered elements described with reference to FIGS. 9 and 18. However, metrology system 600 is configured to collect light diffracted from the specimen 301 at the same angle as the illumination. Metrology system 600 includes a beam splitter 315 configured to redirect collected light 313 diffracted from measurement site 310 toward detector 312 and out of the beam path of illumination light 306. Detector 312 is configured to collect light 313 diffracted from measurement site 310 at the $-1^{st}$ diffraction order. Signals 314 indicative of the light detected by detector 312 are communicated to computing system 330 for analysis. As such, system 600 is configured to provide oblique illumination to one or more structures of a specimen 301 and detect light diffracted from specimen 301 at the $-1^{st}$ diffraction order.

FIG. 20 illustrates a metrology system 700 for measuring characteristics of a specimen in accordance with the exemplary methods presented herein. Metrology system 700 includes like numbered elements described with reference to FIG. 9. In one aspect, metrology system 700 includes a combination of two metrology systems: an oblique illumination spectroscopic ellipsometry (SE) system and a normal incidence reflectometer. The SE system includes an illumination source 302 and an objective 328 that focuses illumination light 306 onto a measurement site 310 of specimen 301. During normal SE operation, zero order diffracted light is collected by objective 329 and detected by detector 304. The reflectometer includes an illumination source 320 and an objective 324 that focuses illumination light 321 onto measurement site 310. During normal reflectometer operation, zero order diffracted light is collected by objective 324, redirected by beam splitter 322, and detected by detector 326.

In a further aspect, metrology system 700 is configured to illuminate measurement site 310 with illumination light 306 from the SE system and collect and detect light 331 diffracted at diffraction orders different from zero with the reflectometer. Similarly, metrology system 700 is configured to illuminate measurement site 310 with illumination light 321 from the reflectometer and collect and detect light 330 diffracted at diffraction orders different from zero with the SE system. In this operational mode, signals 327 are indicative of light diffracted from measurement site 310 at higher orders based on oblique illumination. Similarly, signals 311 are indicative of light diffracted from measurement site 310 at higher orders based on normal incidence illumination.

Figure 21:
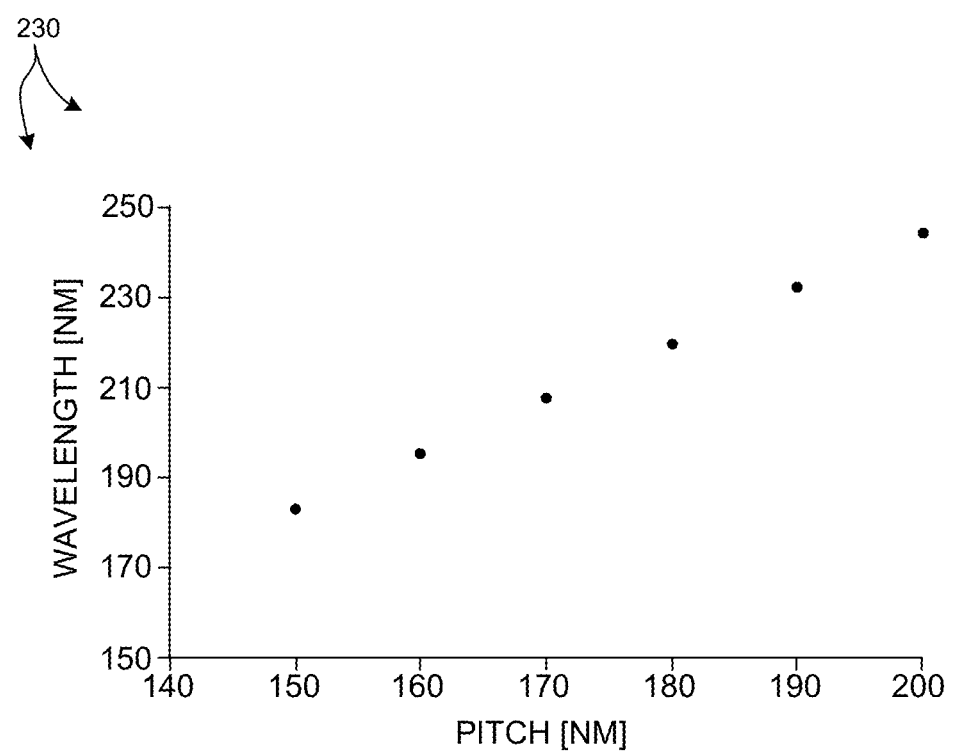
FIG. 21 illustrates a plot 230 indicating the wavelength of light diffracted at the first order and collected for different values of nominal pitch.

FIG. 21 illustrates a plot 230 indicating the wavelength of light diffracted at the first order and collected by detector 326 of the reflectometer for different values of nominal pitch. The illumination light is provided by the SE system (i.e., illumination source 302). Using this approach it is feasible to make measurements of pitch uniformity down to approximately 120 nanometer nominal pitch. This corresponds to detectable wavelength values around 190 nm.

In another further aspect, multiple patterning errors are detected based on the presence of Rayleigh anomalies. Rayleigh anomalies appear when a propagating order goes evanescent. It is a spectral singularity that often appears as a sudden transition in a measured spectrum.

In some embodiments, a metrology system (e.g., the metrology systems described herein) is configured to provide illumination a multiple wavelengths and collection at multiple azimuthal angles. The differences in spectral energy between different azimuthal angles for each of the multiple wavelengths are determined. The presence of geometric errors induced by a multiple patterning process is determined based on a sudden transition in the differences in spectral energy between different azimuth angles over a range of illumination wavelengths.

It is expected that for zero pitch walk, the spectral energy difference between different azimuthal angles versus wavelength is relatively flat. However, for non-zero pitch walk, the spectral energy difference changes significantly below the 1st order wavelength.

Figure 22:
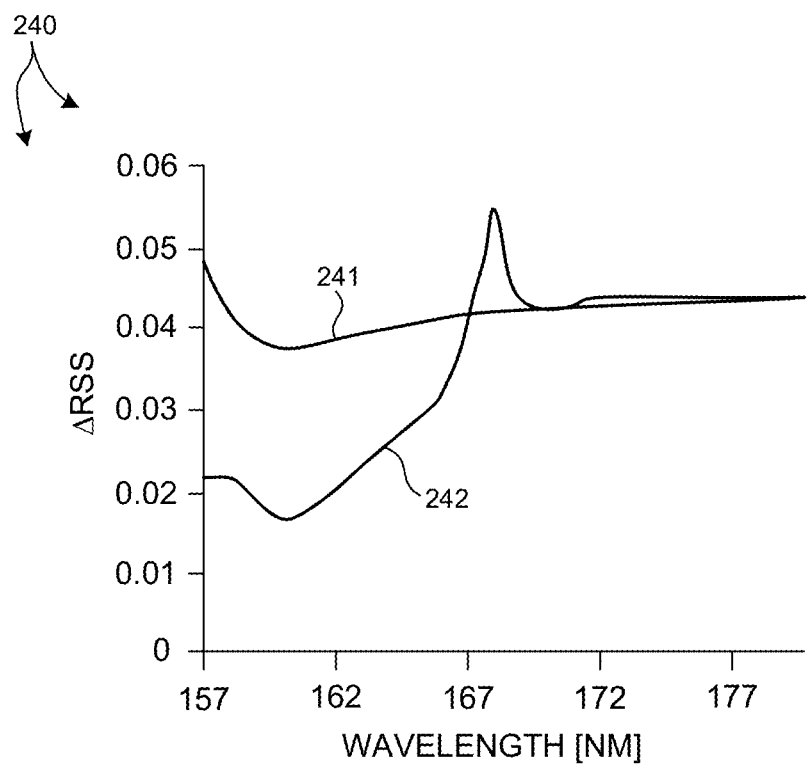
FIG. 22 illustrates a plot 240 indicating the difference in spectral energy between two azimuthal angles over a range of wavelengths for the case of zero pitch walk and two nanometers of pitch walk.

FIG. 22 illustrates a plot 240 indicating the difference in spectral energy (Rss) between two azimuthal angles (0 degrees and 30 degrees) over a range of wavelengths for the case of zero pitch walk (plotline 241) and two nanometers of pitch walk (plotline 242). The metrology target is a periodic structure of oxide on silicon having a nominal pitch of 90 nanometers. The height of each oxide structure is 100 nanometers and the width of each oxide structure is 20 nanometers. The first order diffraction wavelength is approximately 171 nanometers. FIG. 22 clearly illustrates the sudden transition in the difference between the spectral energies at the different azimuthal angles that occurs at the first order diffraction wavelength for the structure that includes pitch walk.

Figure 23:
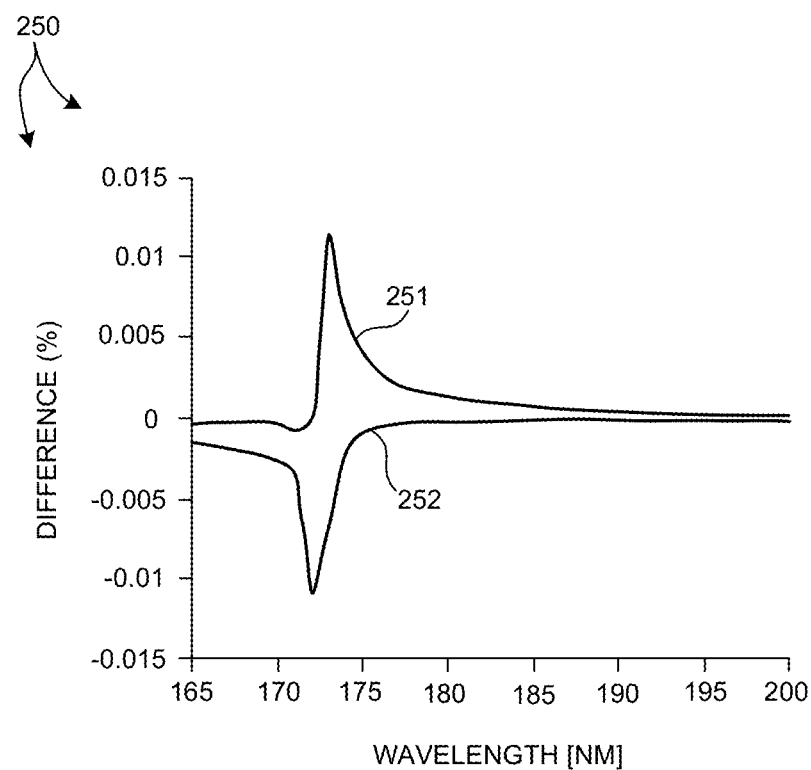
FIG. 23 illustrates a plot 250 indicating the difference in spectral signals for the cases of zero pitch walk and one nanometer pitch walk over a range of wavelengths.

FIG. 23 illustrates a plot 250 indicating the difference in spectral signals, α (plotline 252), and β (plotline 252), for the cases of zero pitch walk and one nanometer pitch walk over a range of wavelengths. The metrology target is a periodic structure of oxide on silicon having a nominal pitch of 90 nanometers. The height of each oxide structure is 50 nanometers. FIG. 23 clearly illustrates the sudden transition in the difference between the spectral signals that occurs at the first order diffraction wavelength when pitch walk is present.

In some other embodiments, solid immersion techniques may be employed to include light diffracted at higher order (i.e., any order different from zero) within the pupil of the system. In this manner, the same detector may be employed to detect both zero order diffracted light and higher order diffracted light, even for systems without a large collection NA.

In yet another further aspect, short wavelength components of the illumination beam are employed to highlight whether a structure is periodic based on the response of the structure to short wavelength illumination. Sufficiently short illumination wavelengths enable the capture of first order diffraction elements that would otherwise be evanescent. In general, it is desireable to reduce the wavelengths associated with the illumination light as much as possible to enhance measurement sensitivity for small pitch structure. Hence, in some embodiments, vacuum ultraviolet illumination light may be desireable.

In some embodiments, it may be desirable to employ apertures separate collected light according to diffraction order, i.e. separate "0" and "−1" order in collection. If illumination and collection modes are such that "0" and "−1" orders overlap and interfere, it may be desirable to implement beam scanning over the grating to evaluate fringe visibility and determine the strength of the 1st order.

In general, detection of higher order diffracted light does not have to be in the pupil plane; wafer plane measurements could also be implemented.

In a further aspect, measurement data from multiple targets is collected for model building, training, and measurement. In some examples, the use of measurement data associated with multiple targets eliminates, or significantly reduces, the effect of under layers in the measurement result. In one example, measurement signals from two targets are subtracted to eliminate, or significantly reduce, the effect of under layers in each measurement result. The use of measurement data associated with multiple targets increases the sample and process information embedded in the model. In particular, the use of training data that includes measurements of multiple, different targets at one or more measurement sites enables more accurate measurements.

In one example, a measurement model is created from spectral measurements of a DOE wafer for both isolated and dense targets. The measurement model is then trained based on the spectral measurement data and known structural parameter values. The resulting trained measurement models are subsequently employed to calculate structural parameter values for both isolated and dense targets on sample wafers. In this manner, each parameter has its own trained model that calculates the parameter value from the measured spectra (or extracted features) associated with both isolated and dense targets.

In another further aspect, measurement data from both measurement targets and assist targets that may be found on-device or within scribe lines is collected for model building, training, and measurement.

In another further aspect, measurement data derived from measurements performed by a combination of multiple, different measurement techniques is collected for model building, training, and measurement. The use of measurement data associated with multiple, different measurement techniques increases the sample and process information embedded in the model and enables more accurate measurements. Measurement data may be derived from measurements performed by any combination of multiple, different measurement techniques. In this manner, different measurement sites may be measured by multiple, different measurement techniques to enhance the measurement information available for characterization of the semiconductor structures.

In general, any measurement technique, or combination of two or more measurement techniques may be contemplated within the scope of this patent document. Exemplary measurement techniques include, but are not limited to spectroscopic ellipsometry, including Mueller matrix ellipsometry, spectroscopic reflectometry, spectroscopic scatterometry, scatterometry overlay, beam profile reflectometry, both angle-resolved and polarization-resolved, beam profile ellipsometry, single or multiple discrete wavelength ellipsometry, transmission small angle x-ray scatterometer (TSAXS), small angle x-ray scattering (SAXS), grazing incidence small angle x-ray scattering (GISAXS), wide angle x-ray scattering (WARS), x-ray reflectivity (XRR), x-ray diffraction (XRD), grazing incidence x-ray diffraction (GIXRD), high resolution x-ray diffraction (HRXRD), x-ray photoelectron spectroscopy (XPS), x-ray fluorescence (XRF), grazing incidence x-ray fluorescence (GIXRF), low-energy electron induced x-ray emission scatterometry (LEXES), x-ray tomography, and x-ray ellipsometry. In general, any metrology technique applicable to the characterization of semiconductor structures, including image based metrology techniques, may be contemplated. Additional sensor options include electrical sensors such as non-contact capacitance/voltage or current/voltage sensors which bias the device and detect the resulting bias with an optical sensor (or the converse), or assisted optical techniques, such as XRD, XRF, XPS, LEXES, SAXS, and pump probe techniques. In one embodiment a two-dimensional beam profile reflectometer (pupil imager) may be used to collect both angle resolved and/or multi-spectral data in a small spot size. A UV Linnik interferometer may also be used as a Mueller matrix spectral pupil imager.

In some examples, the model building, training, and measurement methods described herein are implemented as an element of a SpectraShape® optical critical-dimension metrology system available from KLA-Tencor Corporation, Milpitas, Calif., USA. In this manner, the model is created and ready for use immediately after the DOE wafer spectra are collected by the system.

In some other examples, the model building and training methods described herein are implemented off-line, for example, by a computing system implementing AcuShape® software available from KLA-Tencor Corporation, Milpitas, Calif., USA. The resulting, trained model may be incorporated as an element of an AcuShape® library that is accessible by a metrology system performing measurements.

In another example, the methods and systems described herein may be applied to overlay metrology. Grating measurements are particularly relevant to the measurement of overlay. The objective of overlay metrology is to determine shifts between different lithographic exposure steps. Performing overlay metrology on-device is difficult due to the small size of on-device structures, and the typically small overlay value.

For example, the pitch of typical scribe line overlay metrology structures varies from 200 nanometers to 2,000 nanometers. But, the pitch of on-device, overlay metrology structures is typically 100 nanometers or less. In addition, in a nominal production environment, the device overlay is only a small fraction of the periodicity of the device structure. In contrast, proxy metrology structures used in scatterometry overlay are frequently offset at larger values, e.g., quarter of the pitch, to enhance signal sensitivity to overlay.

Under these conditions, overlay metrology is performed with sensor architectures having sufficient sensitivity to small offset, small pitch overlay. The methods and systems described herein may be employed to obtain a measurement signal sensitive to overlay based on on-device structures, proxy structures, or both.

After acquisition, the measured signals are analyzed to determine overlay error based on variations in the measured signals. In one further aspect, the spectral or angle-resolved data is analyzed using PCA, and an overlay model is trained to determined overlay based on the principal components detected in the measured signal. In one example, the overlay model is a neural network model. In this sense, the overlay model is not a parametric model, and thus is not prone to errors introduced by inaccurate modeling assumptions. As described hereinbefore, the training of the overlay metrology model based on measurements of dedicated metrology structures which are nominally identical to the device features but with larger offsets can help to overcome the sensitivity problem. These offsets can be introduced by fixed design offsets introduced between features in the two layers to be measured during reticle design. The offsets can also be introduced by shifts in the lithography exposure. The overlay error may be extracted more efficiently from the compressed signal (e.g., PCA signal) by using multiple, shifted targets (e.g., pitch/4 and −pitch/4) and the effect of the underlayer may also be reduced.

In general, the methods and systems for performing semiconductor metrology presented herein may be applied directly to actual device structures or to dedicated metrology targets (e.g., proxy structures) located in-die or within scribe lines.

In yet another aspect, the measurement model results described herein can be used to provide active feedback to a process tool (e.g., lithography tool, etch tool, deposition tool, etc.). For example, values of the structural parameters determined using the methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively.

In general, the systems and methods described herein can be implemented as part of the process of preparing a measurement model for off-line or on-tool measurement. In addition, both measurement models and any reparameterized measurement model may describe one or more target structures and measurement sites.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer).

Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A semiconductor wafer, comprising:
   a diffractive metrology target including a first set of structures having a first grating pitch generated by a first patterning step of a multiple patterning process and a second set of structures generated by a subsequent patterning step of the multiple patterning process, the second set of structures offset from the first set of structures by a fraction of the first grating pitch, the first set of structures and the second set of structures generated by the first patterning step and the subsequent patterning step of the multiple patterning process include at least two different pitches; and
   a nominal device structure corresponding to the diffractive metrology target, the nominal device structure including a third set of structures having a third grating pitch generated by the first patterning step of the multiple patterning process and a fourth set of structures generated by the subsequent patterning step, the fourth set of structures offset from the first set of structures by a fraction of the third grating pitch, the third set of structures and the fourth set of structures generated by the first patterning step and the subsequent patterning step of the multiple patterning process include a uniform pitch.

2. The semiconductor wafer of claim 1, wherein the diffractive metrology target is located in a scribe line of the semiconductor wafer.

3. The semiconductor wafer of claim 1, wherein the nominal structure is located within a die of the semiconductor wafer.

4. The semiconductor wafer of claim 1, wherein the diffractive metrology target and the corresponding nominal structure have the same overlay.

5. The semiconductor wafer of claim 1, wherein an overlay of the diffractive metrology target is offset by a known amount from an overlay of the nominal structure.

* * * * *